US011105872B2

United States Patent
Kawajiri et al.

(10) Patent No.: US 11,105,872 B2
(45) Date of Patent: Aug. 31, 2021

(54) MAGNETIC RESONANCE IMAGING APPARATUS WITH ENHANCED IMAGE QUALITY

(71) Applicant: Canon Medical Systems Corporation, Otawara (JP)

(72) Inventors: Sho Kawajiri, Nasushiobara (JP); Motohiro Miura, Yaita (JP); Masashi Hori, Nasushiobara (JP); Takahiro Kobayashi, Otawara (JP)

(73) Assignee: Canon Medical Systems Corporation, Otawara (JP)

( * ) Notice: Subject to any disclaimer, the term of this patent is extended or adjusted under 35 U.S.C. 154(b) by 148 days.

(21) Appl. No.: 16/010,640

(22) Filed: Jun. 18, 2018

(65) Prior Publication Data

US 2018/0372820 A1 Dec. 27, 2018

(30) Foreign Application Priority Data

Jun. 26, 2017 (JP) .............................. JP2017-124473

(51) Int. Cl.
*G01R 33/385* (2006.01)
(52) U.S. Cl.
CPC ................. *G01R 33/3852* (2013.01)
(58) Field of Classification Search
None
See application file for complete search history.

(56) References Cited

U.S. PATENT DOCUMENTS

| 2006/0208798 | A1* | 9/2006 | Labbe | ..................... H03F 3/217 |
| | | | | 330/251 |
| 2013/0127532 | A1* | 5/2013 | Huisman | ............ G01R 33/3852 |
| | | | | 330/251 |
| 2017/0160358 | A1* | 6/2017 | Miura | ................ G01R 33/3852 |

FOREIGN PATENT DOCUMENTS

| JP | 64-086959 | 3/1989 |
| JP | 10-080413 | 3/1998 |
| JP | 2013-535946 | 9/2013 |
| JP | 2015-512737 A | 4/2015 |
| JP | WO2015-159694 A1 | 4/2017 |

OTHER PUBLICATIONS

Japanese Office Action dated Jun. 15, 2021, issued in Japanese Patent Application No. 2017-124473.

* cited by examiner

*Primary Examiner* — Douglas X Rodriguez
(74) *Attorney, Agent, or Firm* — Oblon, McClelland, Maier & Neustadt, L.L.P.

(57) ABSTRACT

According to one embodiment, a magnetic resonance imaging apparatus includes an amplifier, a gradient coil, and adjusting circuitry. The amplifier includes pulse width modulation circuitry modulating a pulse width of a driving signal, which is input to switching elements, in accordance with an input of a control signal corresponding to a waveform of a gradient magnetic field. The gradient coil generates the gradient magnetic field by an electric current supplied in accordance with an output voltage which is output from the amplifier. The adjusting circuitry executes adjustment of a gain of the amplifier, which is included in the control signal, or adjustment of the pulse width of the driving signal, in accordance with a dead time included in a switching cycle of the switching elements.

12 Claims, 23 Drawing Sheets

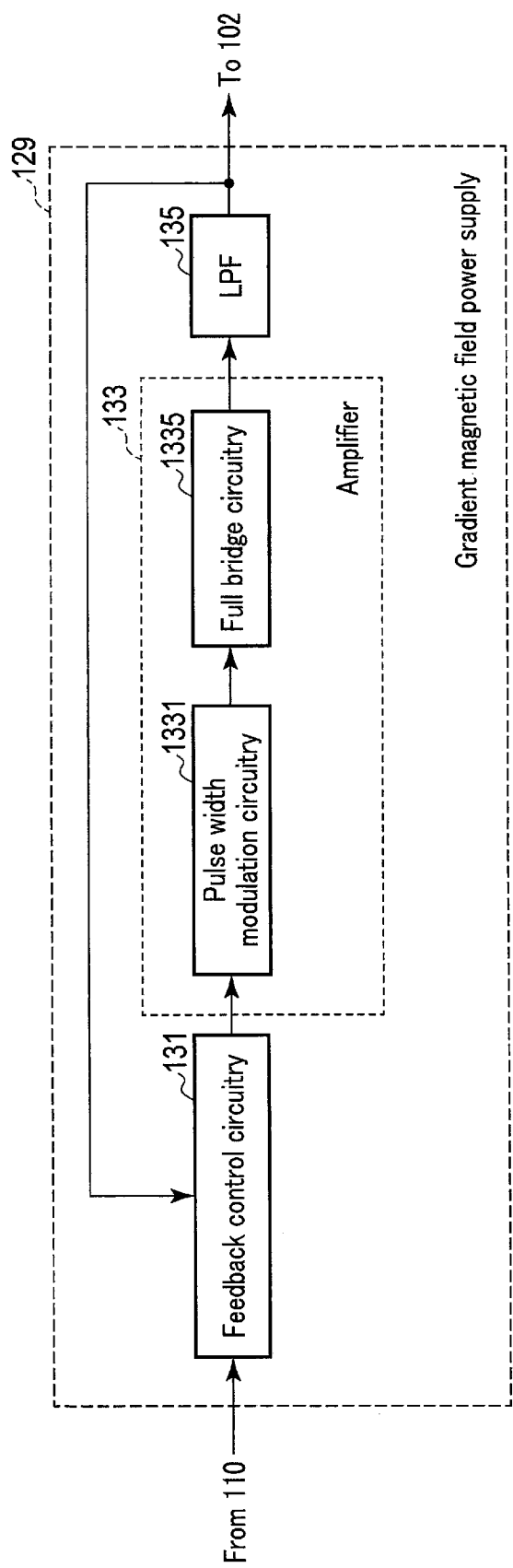
F I G. 2

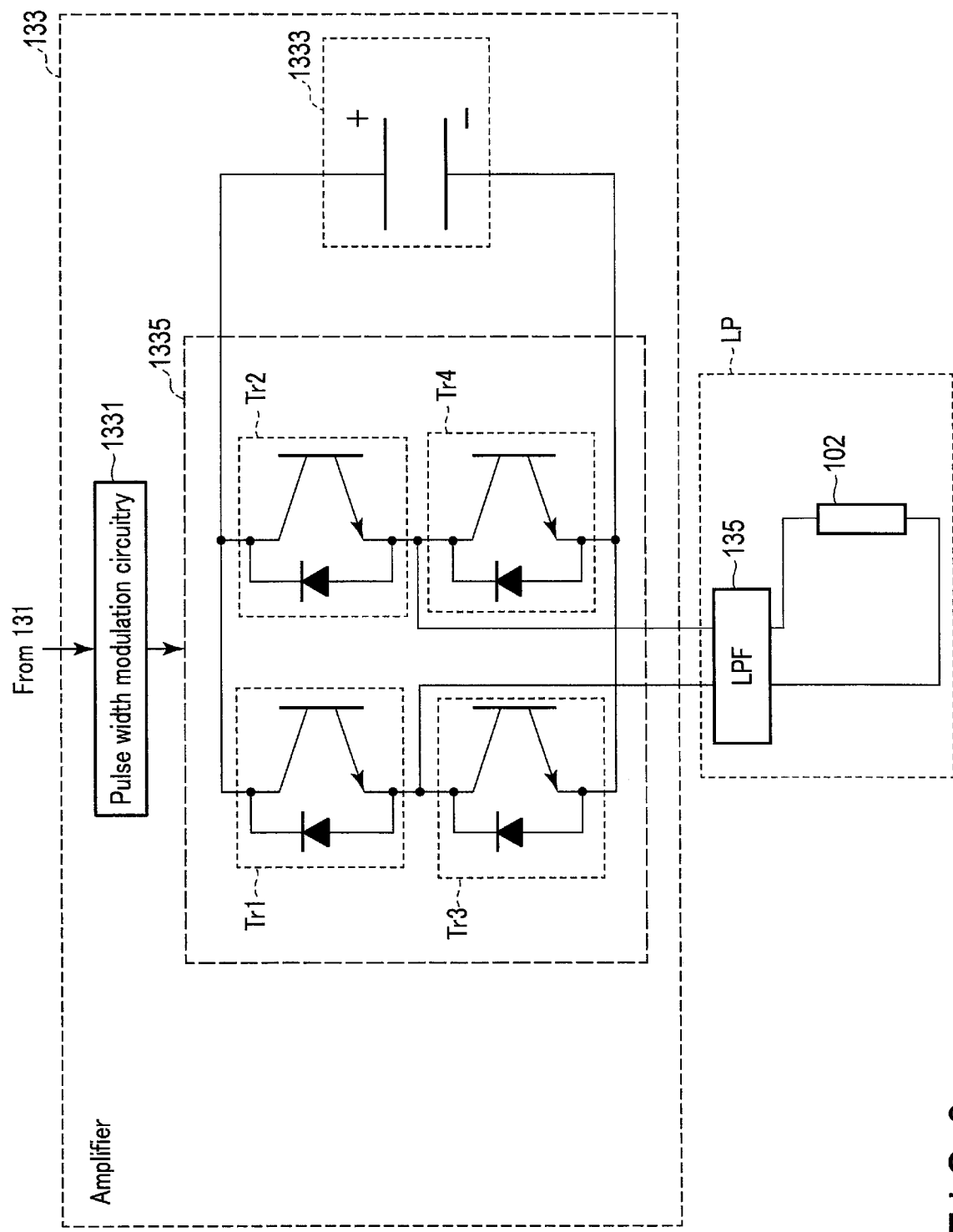
F I G. 3

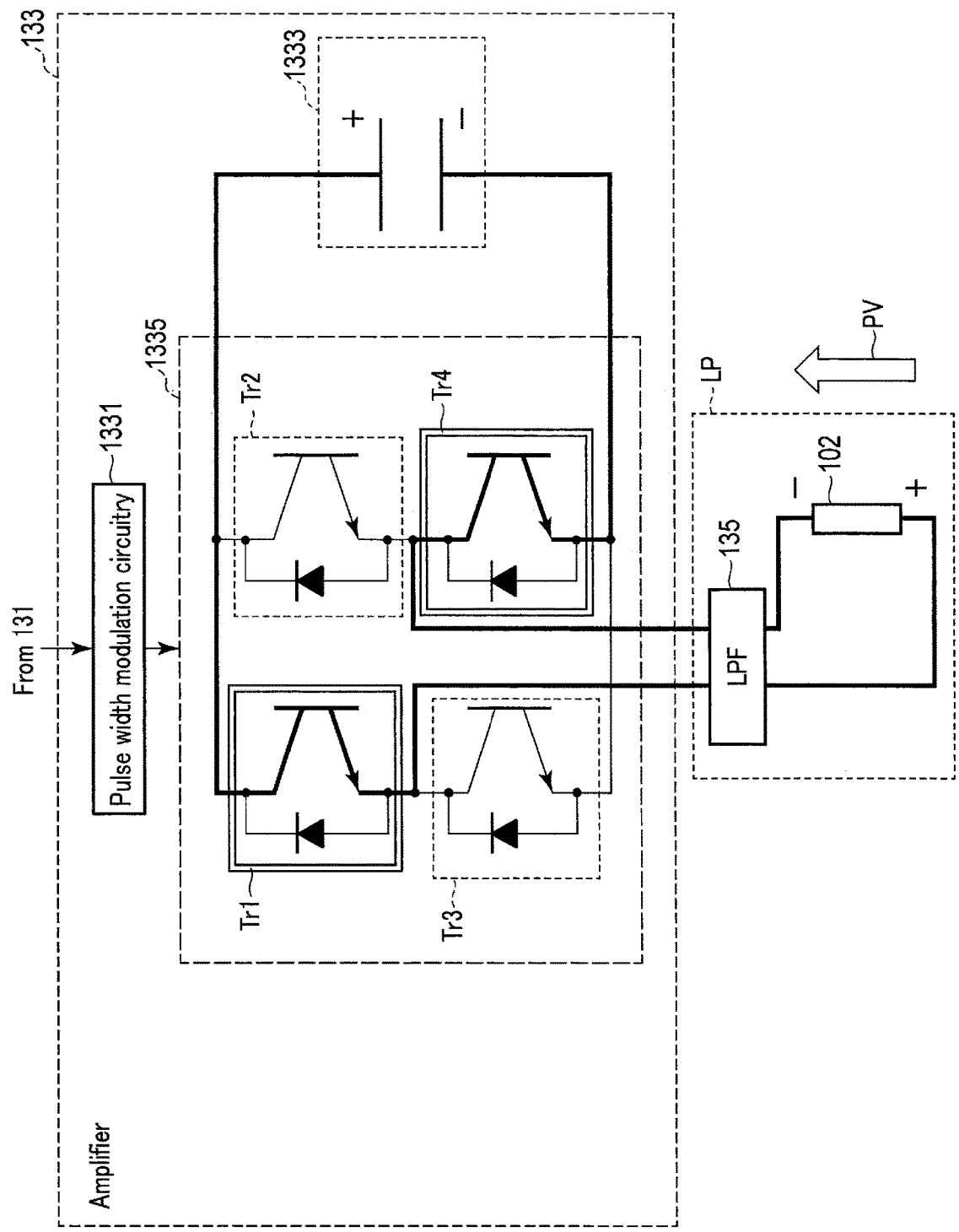
F I G. 4

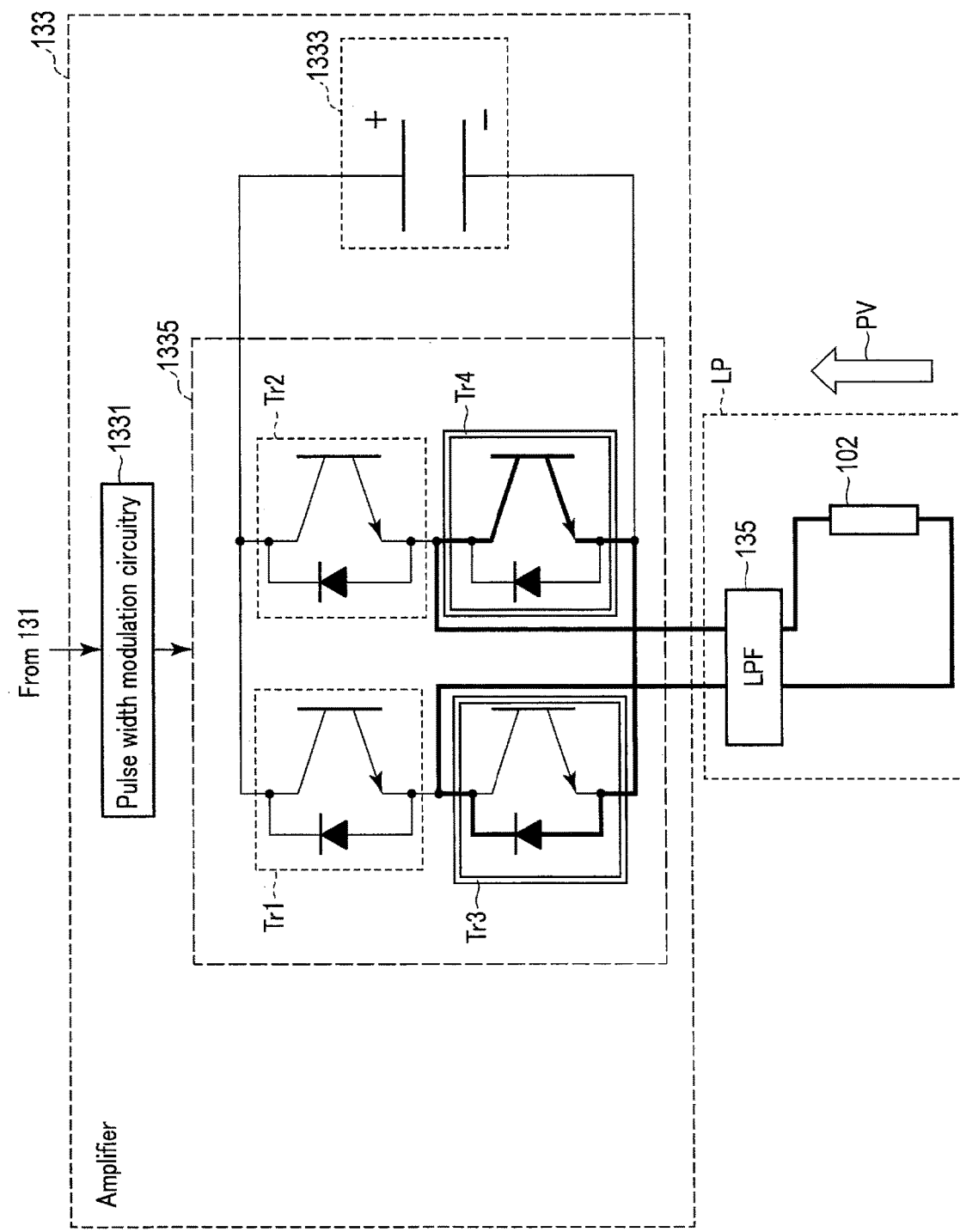
F I G. 7

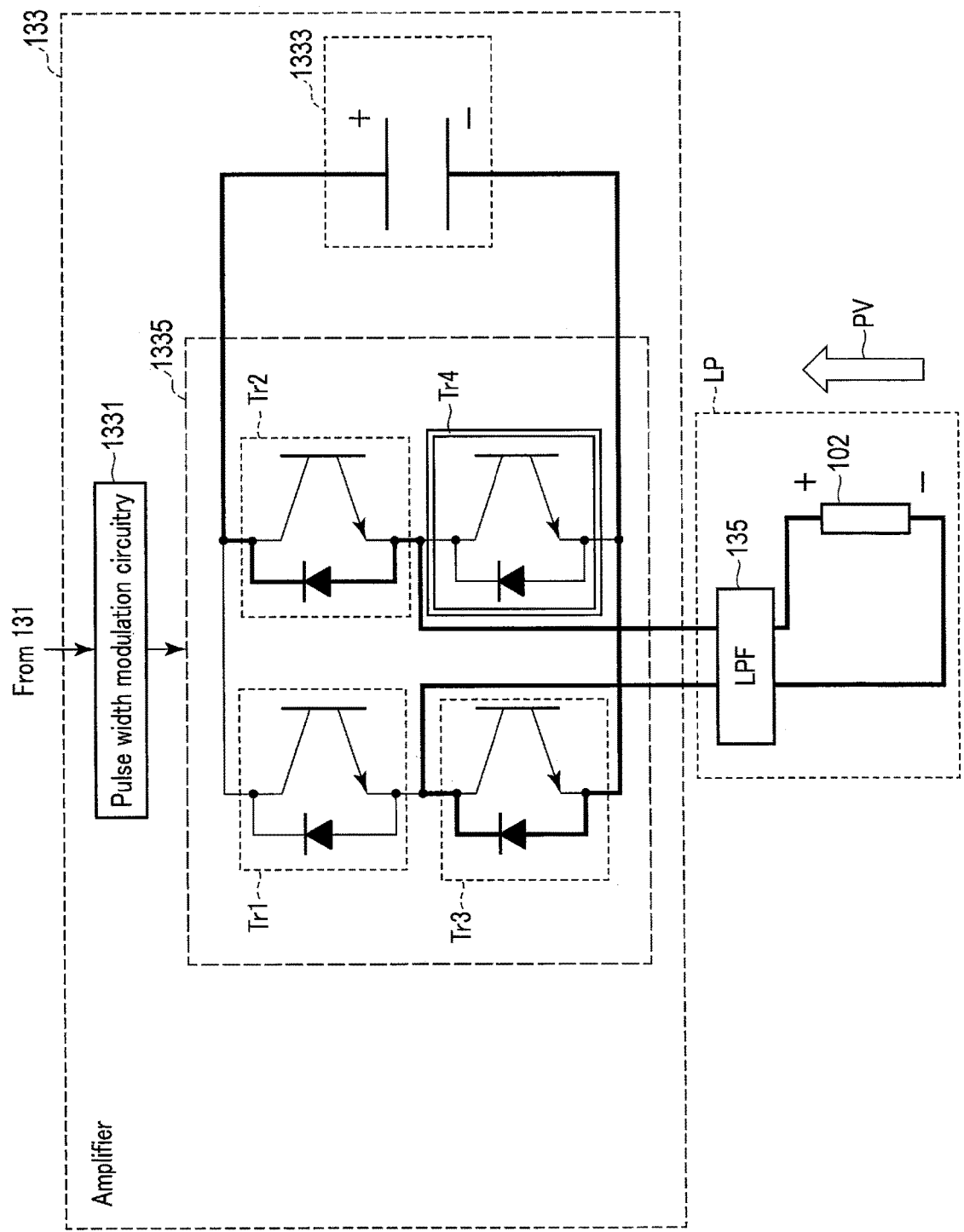
F I G. 12

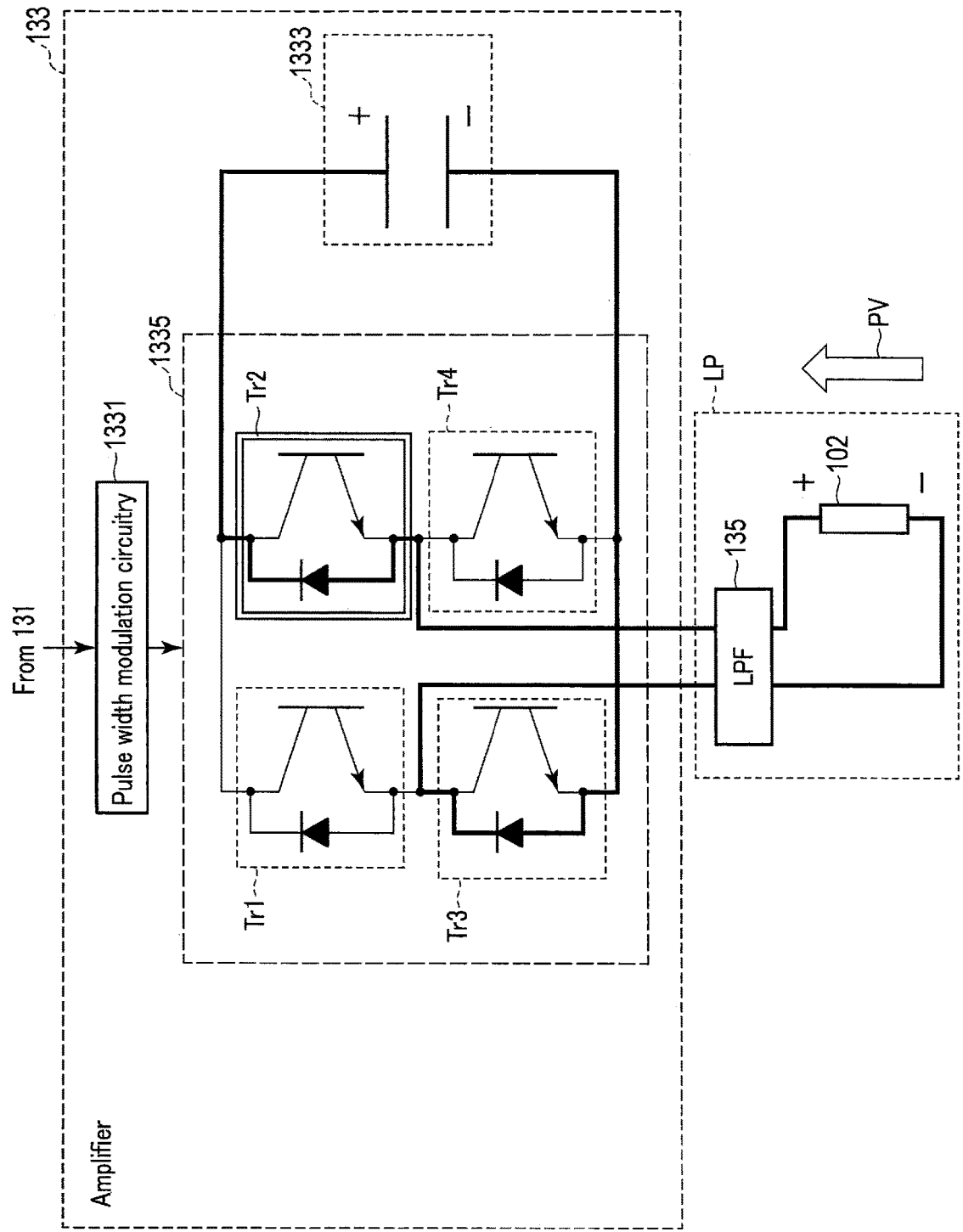
F I G. 16

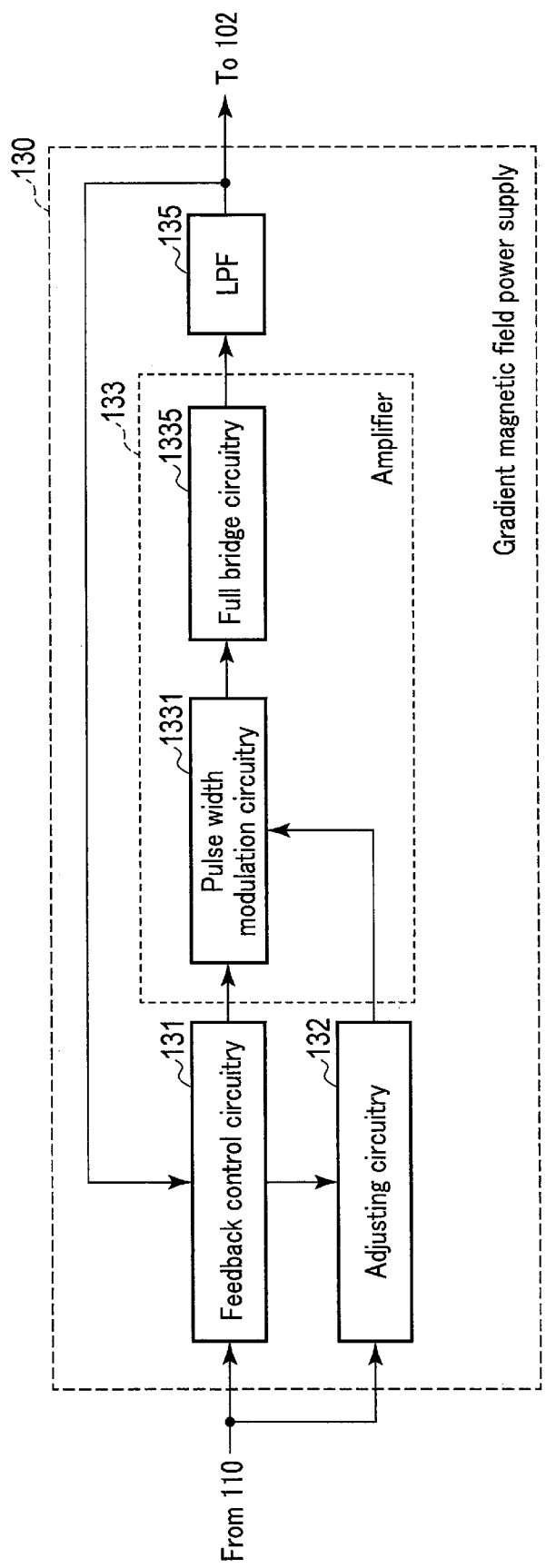
F I G. 18

MAGNETIC RESONANCE IMAGING APPARATUS WITH ENHANCED IMAGE QUALITY

CROSS-REFERENCE TO RELATED APPLICATIONS

This application is based upon and claims the benefit of priority from the prior Japanese Patent Application No. 2017-124473, filed Jun. 26, 2017, the entire contents of which are incorporated herein by reference.

FIELD

Embodiments described herein relate generally to a magnetic resonance imaging apparatus.

BACKGROUND

An amplification amplifier (power stage) in a gradient magnetic field power supply device of a magnetic resonance imaging (MRI) apparatus is composed of a class-D amplifier which includes a plurality of semiconductor switches. The amplification amplifier outputs a large voltage to a gradient coil (inductive load). The amplification amplifier realizes a high-speed operation and a large voltage output by connecting in series the outputs of plural full-bridge circuitries in the class-D amplifier. In this case, in general, the gradient magnetic field power supply device executes control for outputting an arbitrary current waveform to the gradient coil. Each time the output of voltage in the control of the current waveform is switched, a timing (dead time) for turning off all semiconductor switches is needed. By this dead time, the output voltage that is output from the amplification amplifier varies at the rising of the current, at which the value of the current in the gradient coil varies away from zero, and at the falling of the current, at which the value of the current approaches zero. Due to the variation of the output voltage, symmetry deteriorates between the current waveform at the rising of current and the current waveform at the falling of current. Consequently, the timing of occurrence of an MR signal deviates from an ideal one, and this may lead to degradation in image quality.

BRIEF DESCRIPTION OF THE DRAWINGS

FIG. 2 is a block diagram illustrating the configuration of a gradient magnetic field power supply which is a comparative example of a gradient magnetic field power supply of the embodiment.

FIG. 3 is a view illustrating an example of a circuitry configuration of a part of an amplifier and a load part connected to the amplifier.

FIG. 4 is a view illustrating a path of an electric current relating to the load part in a case in which transistors Tr1 and Tr4 are turned on and transistors Tr2 and Tr3 are turned off.

FIG. 7 is a view illustrating a path of an electric current relating to the load part in a case in which the transistors Tr3 and Tr4 are turned on and the transistors Tr1 and Tr2 are turned off.

FIG. 11 is a view illustrating a path of an electric current relating to the load part in a case in which the transistor Tr1 is turned on.

FIG. 12 is a view illustrating a path of an electric current relating to the load part in a case in which the transistor Tr4 is turned on.

FIG. 15 is a view illustrating a path of an electric current relating to the load part in a case in which the transistor Tr3 is turned on.

FIG. 16 is a view illustrating a path of an electric current relating to the load part in a case in which the transistor Tr2 is turned on.

FIG. 18 is a block diagram illustrating the configuration of the gradient magnetic field power supply in the embodiment.

DETAILED DESCRIPTION

Figure 1:
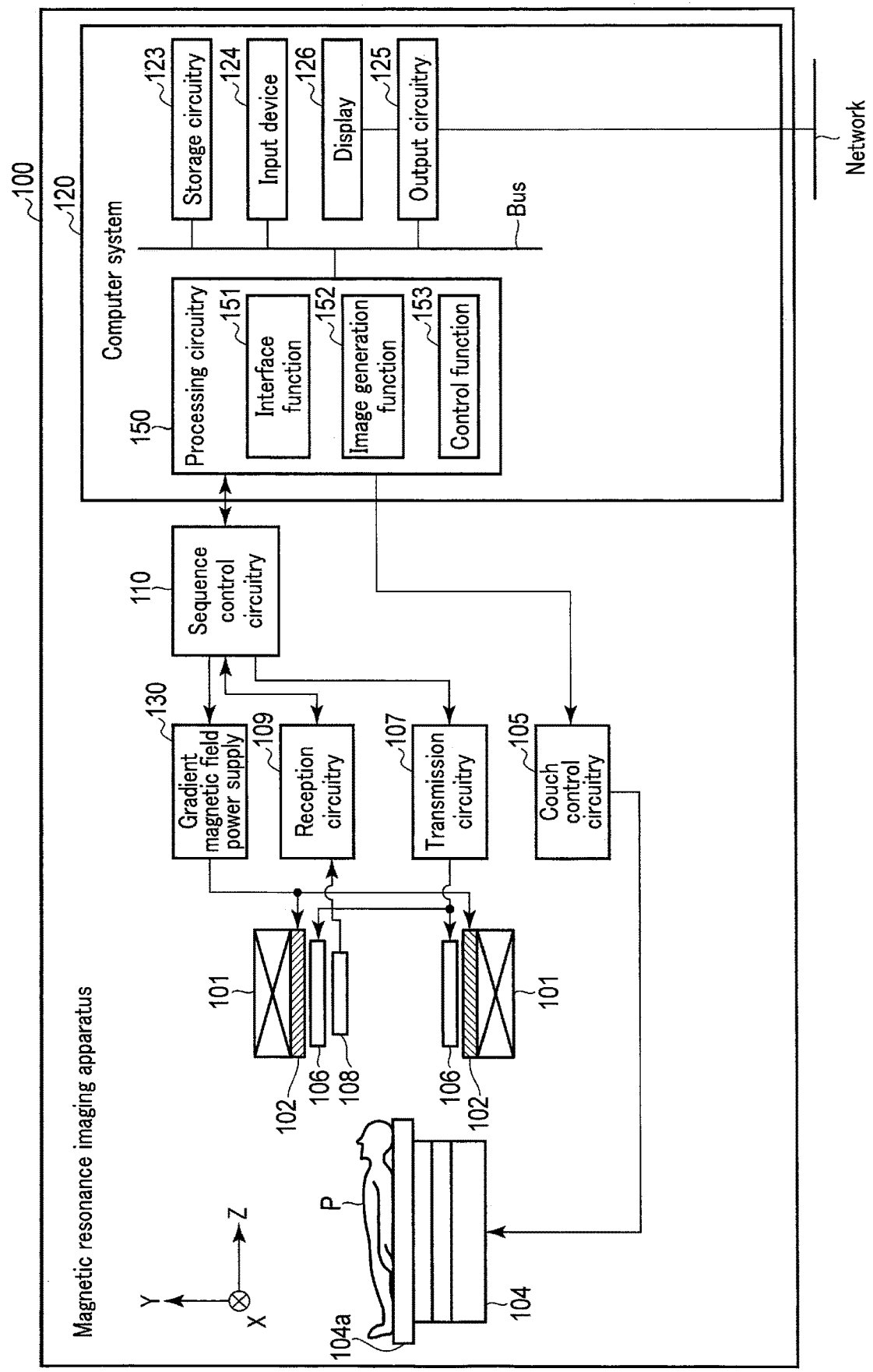
FIG. 1 is a block diagram illustrating the configuration of a magnetic resonance imaging apparatus according to an embodiment.

In general, according to one embodiment, a magnetic resonance imaging apparatus includes an amplifier, a gradient coil and adjusting circuitry. The amplifier includes pulse width modulation circuitry configured to modulate a pulse width of a driving signal, which is input to a plurality of switching elements, in accordance with an input of a control signal corresponding to a waveform of a gradient magnetic field. The gradient coil is configured to generate the gradient magnetic field by an electric current supplied in accordance with an output voltage which is output from the amplifier. The adjusting circuitry is configured to execute adjustment of a gain of the amplifier, which is included in the control signal, or adjustment of the pulse width of the driving signal, in accordance with a dead time included in a switching cycle of the switching elements.

The object is to provide a magnetic resonance imaging apparatus which can enhance image quality.

Hereinafter, a magnetic resonance imaging apparatus according to an embodiment will be described in detail with reference to the accompanying drawings. In the description below, structural elements having substantially the same function and structure are denoted by like reference numerals, and an overlapping description is given only where necessary.

Referring to FIG. 1, a description is given of the entire configuration of a magnetic resonance imaging apparatus 100 according to the embodiment. FIG. 1 is a block diagram illustrating the configuration of the magnetic resonance imaging apparatus 100 in the embodiment.

As illustrated in FIG. 1, the magnetic resonance imaging apparatus 100 includes a static field magnet 101, a gradient coil 102, a gradient magnetic field power supply 130, a couch 104, couch control circuitry 105, a transmitter coil 106, transmission circuitry 107, a receiver coil 108, reception circuitry 109, sequence control circuitry 110, and a computer system 120.

The static field magnet 101 is a magnet formed in a hollow cylindrical shape, and generates a uniform static field in the hollow space. The static field magnet 101 is, for example, a permanent magnet, a superconducting magnet, or a resistive magnet.

The gradient coil 102 is a coil formed in a hollow cylindrical shape. The gradient coil 102 is disposed in the inside of the static field magnet 101. The gradient coil 102 is formed by combining three coils (not shown) corresponding to X-, Y- and Z-axes which are orthogonal to each other. These three coils generate gradient magnetic fields having field intensities varying along the X-, Y- and Z-axes, by currents due to application of output voltages which are individually output from the gradient magnetic field power supply 130. Incidentally, a Z-axis direction is identical to the direction of the static field. In addition, a Y-axis direction is a vertical direction, and an X-axis direction is a direction perpendicular to the Z-axis and Y-axis.

The gradient magnetic field power supply 130 supplies current to the gradient coil 102. The detailed configuration of the gradient magnetic field power supply 103 will be described later.

The couch 104 includes a couch top 104a on which a subject P is placed. Under the control of couch control circuitry 105, the couch top 104a in a state in which the subject P is placed thereon is inserted into a cavity (imaging port) of the gradient coil 102.

The transmitter coil 106 is disposed in the inside of the gradient coil 102. The transmitter coil 106 receives RF (Radio Frequency) pulses from the transmission circuitry 107, and generates a radio frequency magnetic field.

The transmission circuitry 107 supplies to the transmitter coil 106 the RF pulses corresponding to a Larmor frequency which is determined by the kind of atomic nucleus that is a target, and the intensity of the magnetic field.

The receiver coil 108 is disposed in the inside of the gradient coil 102, and receives an MR (Magnetic Resonance) signal which is emitted from the subject P by the influence of the radio frequency magnetic field. The receiver coil 108 outputs the received MR signal to the reception circuitry 109.

The reception circuitry 109 generates MR data, based on the MR signal which is output from the receiver coil 108. The reception circuitry 109 transmits the MR data to the sequence control circuitry 110.

Based on the information of an imaging sequence which is transmitted from the computer system 120, the sequence control circuitry 110 drives the gradient magnetic field power supply 130, transmission circuitry 107 and reception circuitry 109, and carries out MR imaging on the subject P. In the information of the imaging sequence, the following, for instance, are defined: the intensity of power which the gradient magnetic field power supply 130 supplies to the gradient coil 102; the timing of supplying the power; the intensity of an RF pulse which the transmission circuitry 107 transmits to the transmission coil 106; the timing of applying the RF pulse; and the timing at which the reception circuitry 109 detects the MR signal. For example, the sequence control circuitry 110 outputs to the gradient magnetic field power supply 130 an input signal $I_{in}$ corresponding to a waveform of a gradient magnetic field in the imaging sequence. If the sequence control circuitry 110 receives the MR data from the reception circuitry 109 in the MR imaging on the subject P, the sequence control circuitry 110 transfers the received MR data to the computer system 120. The sequence control circuitry 110 is an example of a sequence controller.

The computer system 120 executes overall control of the magnetic resonance imaging apparatus 100, data collection, image generation, etc. The computer system 120 includes processing circuitry 150, storage circuitry 123, an input device 124, output circuitry 125, and a display 126. In addition, the processing circuitry 150 includes an interface function 151, an image generation function 152 and a control function 153.

In the present embodiment, the respective processing functions, which are executed by the interface function 151, image generation function 152 and control function 153, are stored in the storage circuitry 123 in the form of computer-executable programs. The processing circuitry 150 is a processor which reads out the programs from the storage circuitry 123, and executes the programs, thereby realizing the functions corresponding to the respective programs. In other words, the processing circuitry 150 in the state in which the processing circuitry 150 has read out the programs includes the respective functions illustrated in the processing circuitry 150 in FIG. 1.

In the meantime, in FIG. 1, the description was given on the assumption that the processing functions, which are executed by the interface function 151, image generation function 152 and control function 153, are realized by the single processing circuitry 150. However, the processing circuitry 150 may be constituted by combining a plurality of independent processors, and the respective processors may realize the functions by executing the programs. In other words, there may be either a case in which the above-described functions are composed as programs and the single processing circuitry executes the respective programs, or a case in which a specific function is implemented in independent purpose-specific program-executing circuitry. Incidentally, the interface function 151, image generation function 152 and control function 153, which are included in the processing circuitry 150, are examples of an interface unit, an image generator and a controller, respectively.

The term "processor" used in the above description means, for example, a CPU (Central Processing Unit), a GPU (Graphical Processing Unit), or circuitry such as an ASIC (Application Specific Integrated Circuit), or a programmable logic device (e.g. SPLD (Simple Programmable Logic Device), CLPD (Complex Programmable Logic Device), FPGA (Field Programmable Gate Array)).

The processors realize the functions by reading out and executing the programs stored in the storage circuitry 123. Instead of storing the programs in the storage circuitry 123, such a configuration may be adopted that the programs are directly incorporated in the circuitry in the processors. In this case, the processors realize the functions by reading out and executing the programs incorporated in the circuitry in the processors. Besides, the couch control circuitry 105, transmission circuitry 107, reception circuitry 109 and sequence control circuitry 110 are similarly composed of electronic circuitry such as the above-described processors.

The processing circuitry 150 transmits, by the interface function 151, the information of the imaging sequence to the sequence control circuitry 110, and receives the MR data from the sequence control circuitry 110. In addition, if the processing circuitry 150 receives the MR data, the processing circuitry 150 stores the received MR data in the storage circuitry 123. The processing circuitry 150 generates images by the image generation function 152, by using the received MR data, and the data stored in the storage circuitry 123. In the meantime, the processing circuitry 150 transmits, where necessary, the generated images to the display 126 or storage circuitry 123. The processing circuitry 150 executes overall control of the magnetic resonance imaging apparatus 100 by the control function 153. For example, the processing circuitry 150 generates, by the control function 153, the information of the imaging sequence, based on an imaging condition which is input by an operator through the input device 124. The processing circuitry 150 controls, by the control function 153, the MR imaging by sending the information of the imaging sequence to the sequence control circuitry 110.

The storage circuitry 123 stores the MR data which the processing circuitry 150 received via the interface function 151, the image data generated by the image generation function 152, and the programs corresponding to the various functions which are executed by the processing circuitry 150. For example, the storage circuitry 123 is a RAM (Random Access Memory), a semiconductor memory element such as a flash memory, a hard disk, an optical disc, etc. The storage circuitry 123 corresponds to a storage unit.

The input device 124 accepts various instructions and information inputs from the operator. The input device 124 is, for example, a pointing device such as a mouse, or an input device such as a keyboard. The input device is realized by input interface circuitry. Incidentally, the input device 124 is not limited to a device including a physical operation part, such as a mouse or a keyboard. Examples of the input interface circuitry include processing circuitry of electric signals, which receives electric signals corresponding to an input operation from an external input device, which is provided separately from the magnetic resonance imaging apparatus 100, and outputs the received electric signals to various circuitry.

The output circuitry 125 causes the display 126 to display various kinds of information such as image data, under the control by the control function 153 in the processing circuitry 150. The display 126 is, for example, a display device such as a liquid crystal display. The output circuitry 125 corresponds to an output unit.

The entire configuration of the magnetic resonance imaging apparatus 100 in the embodiment has been described above. Next, referring to FIG. 2 to FIG. 17, a dead time in the gradient magnetic field power supply will be described. FIG. 2 is a block diagram illustrating the configuration of a gradient magnetic field power supply 129 which is a comparative example of the gradient magnetic field power supply 130 of the embodiment. The gradient magnetic field power supply 129 does not include adjusting circuitry 132 of the embodiment which will be described later. FIG. 3 is a view illustrating an example of a circuitry configuration of a part of an amplifier 133 and an example of a load part LP connected to the amplifier 133.

The gradient magnetic field power supply 129 of the comparative example includes feedback control circuitry 131, the amplifier 133, and a low pass filter (hereinafter referred to as "LPF") 135. The feedback control circuitry 131 executes feedback control on the input signal $I_{in}$ which is input from the sequence control circuitry 110, by using a signal relating to a current by an output voltage which is output from the LPF 135. The feedback control circuitry 131 is composed of, for example, various circuitries which execute PID (Proportional-Integral-Differential) control, processors, etc. The feedback control circuitry 131 outputs a result of the feedback control to the amplifier 133 as a control signal on which pulse width modulation (PWM) is executed.

The amplifier 133 includes pulse width modulation circuitry 1331, a power supply 1333 and full bridge circuitry 1335. The pulse width modulation circuitry 1331 executes pulse width modulation on the control signal. The pulse width modulation circuitry 1331 outputs the control signal, on which the pulse width modulation was executed, to the full bridge circuitry 1335 as a driving signal to each of a plurality of switching elements in the full bridge circuitry 1335.

The power supply 1333 includes, for example, an AC/DC converter (not shown) and a capacitor bank (not shown). The AC/DC converter is, for example, a predetermined DC power supply which rectifies an AC that is output from an AC power supply. The capacitor bank temporarily stores electric power which is output from the AC/DC converter, and outputs the stored power to the full bridge circuitry 1335 where necessary.

The full bridge circuitry 1335 includes a plurality of switching elements. Specifically, the full bridge circuitry is a class-D amplifier which uses semiconductor switches (transistors) as the switching elements. The full bridge circuitry 1335 is provided in the amplifier in association with each of an X-axis gradient coil, a Y-axis gradient coil and a Z-axis gradient coil. Specifically, the full bridge circuitry 1335 includes four transistors (Tr1, Tr2, Tr3, Tr4) as the semiconductor switches, and a plurality of regenerative diodes corresponding to the transistors. Each switching element (Tr1, Tr2, Tr3, Tr4) executes ON/OFF of switching in accordance with the driving signal. Thereby, the direction of a voltage, which is applied to the load part LP, is controlled.

The load part LP for the output from the amplifier 133 is composed of the LPF 135 and gradient coil 102. The LPF 135 smooths the voltage which is output from the full bridge circuitry 1335. The impedance of the gradient coil 102 is an inductive load with a large inductance component.

Figure 5:
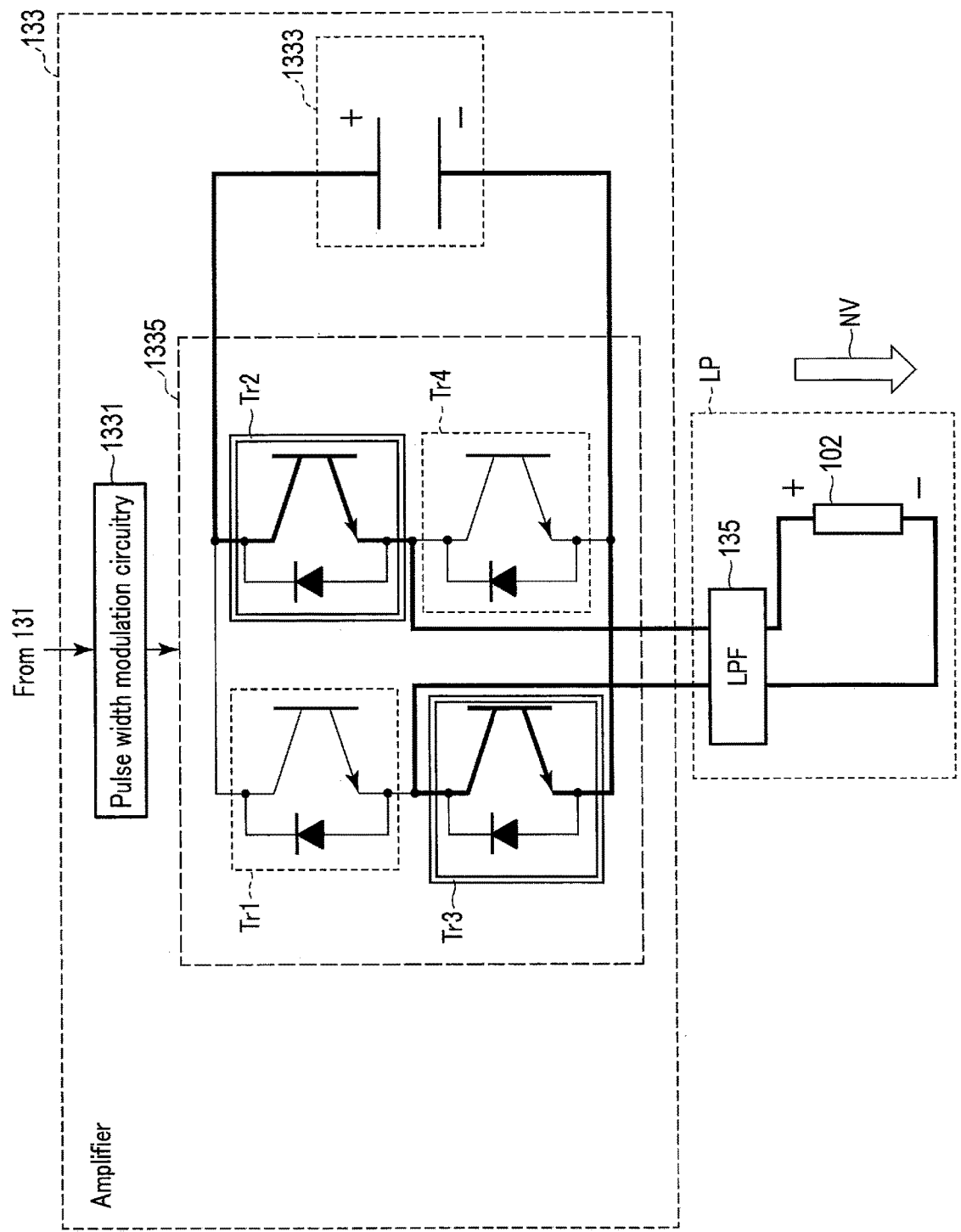
FIG. 5 is a view illustrating a path of an electric current relating to the load part in a case in which the transistors Tr2 and Tr3 are turned on and the transistors Tr1 and Tr4 are turned off.

FIG. 4 is a view illustrating, together with a path of an electric current (a thick line in FIG. 4) relating to the load part LP, a direction PV of a voltage which is applied to the load part LP, in a case in which transistors Tr1 and Tr4 surrounded by double lines are turned on and transistors Tr2 and Tr3 are turned off. FIG. 5 is a view illustrating, together with a path of an electric current (a thick line in FIG. 5) relating to the load part LP, a direction NV of a voltage which is applied to the load part LP, in a case in which transistors Tr2 and Tr3 surrounded by double lines are turned on and transistors Tr1 and Tr4 are turned off. As illustrated in FIG. 4 and FIG. 5, by the ON/OFF switching of the transistors (Tr1, Tr2, Tr3, Tr4), the direction of the voltage that is applied to the load part LP is reversed. Hereinafter, for the purpose of convenience of description, the direction PV of the voltage corresponding to FIG. 4 is defined as "positive-directional voltage" and the direction NV of the voltage corresponding to FIG. 5 is defined as "negative-directional voltage".

Hereinafter, in order to simplify the description, the operation mode of the transistors as illustrated in FIG. 4, in which the transistor Tr1 and transistor Tr4 surrounded by the double lines are turned on and the transistor Tr2 and transistor Tr3 are turned off, is referred to as "first mode m1". Besides, the operation mode of the transistors, in which the transistor Tr1 and transistor Tr2 are turned on and the transistor Tr3 and transistor Tr4 are turned off, is referred to as "second mode m2".

Figure 6:
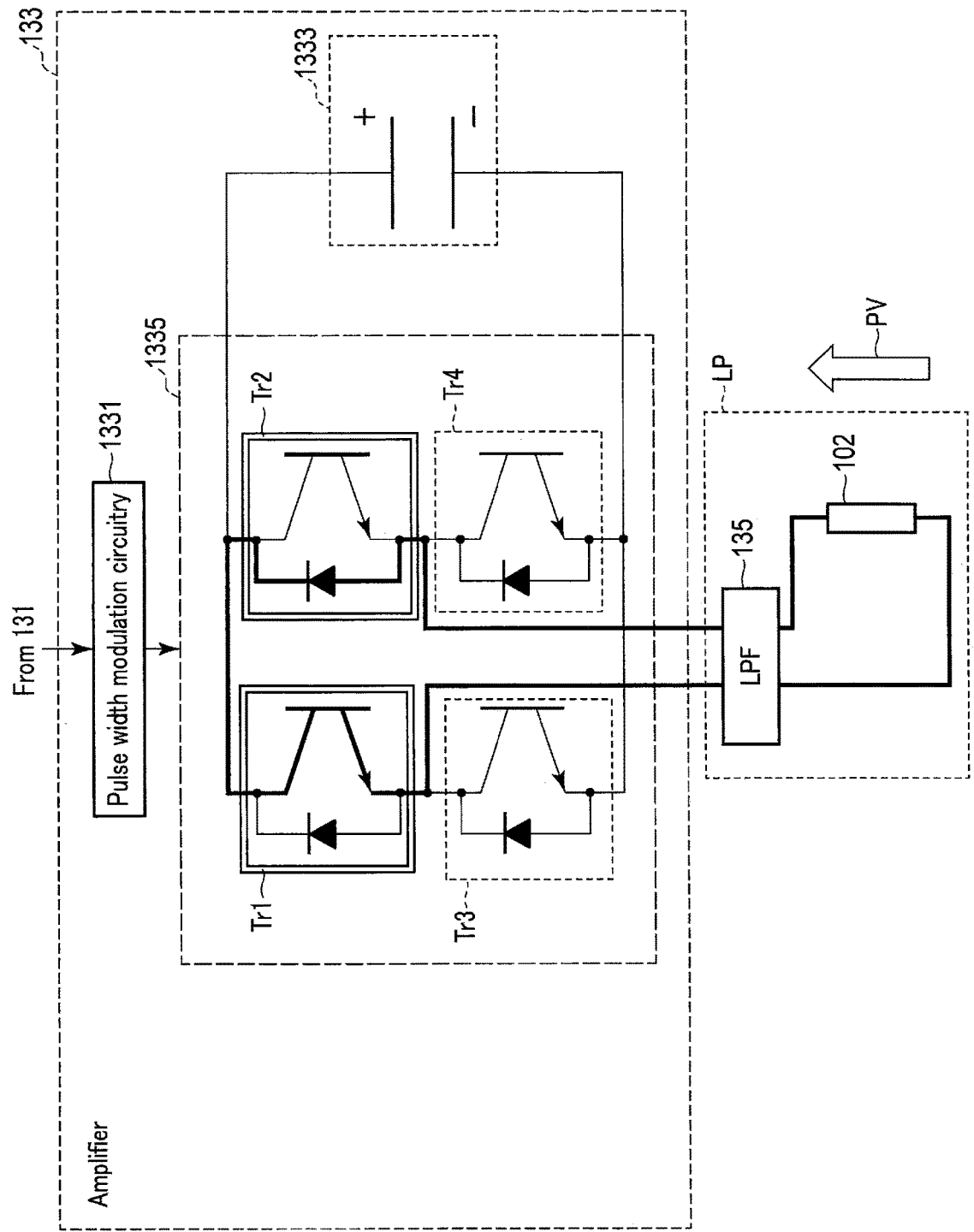
FIG. 6 is a view illustrating a path of an electric current relating to the load part in a case in which the transistors Tr1 and Tr2 are turned on and the transistors Tr3 and Tr4 are turned off.

FIG. 6 is a view illustrating, in the second mode m2, the path of an electric current (a thick line in FIG. 6) relating to the load part LP together with the direction PV of an output voltage. In FIG. 6, the transistor Tr1 and transistor Tr2 surrounded by double lines are indicative of the ON state. In addition, the operation mode of the transistors, in which the transistor Tr3 and transistor Tr4 are turned on and the transistor Tr1 and transistor Tr2 are turned off, is referred to as "third mode m3".

FIG. 7 is a view illustrating, in the third mode m3, the path of an electric current (a thick line in FIG. 7) relating to the load part LP together with the direction PV of an output voltage. In FIG. 7, the transistor Tr3 and transistor Tr4 surrounded by double lines are indicative of the ON state. In addition, the operation mode of the transistors as illustrated in FIG. 5, in which the transistor Tr2 and transistor Tr3 surrounded by double lines are turned on and the transistor Tr1 and transistor Tr4 are turned off, is referred to as "fourth mode m4".

Specifically, the first mode m1 is an operation mode in which the positive-directional voltage PV is applied to the load part LP, and the fourth mode m4 is an operation mode in which the negative-directional voltage NV is applied to the load part LP.

(PWM Control)

Figure 8:
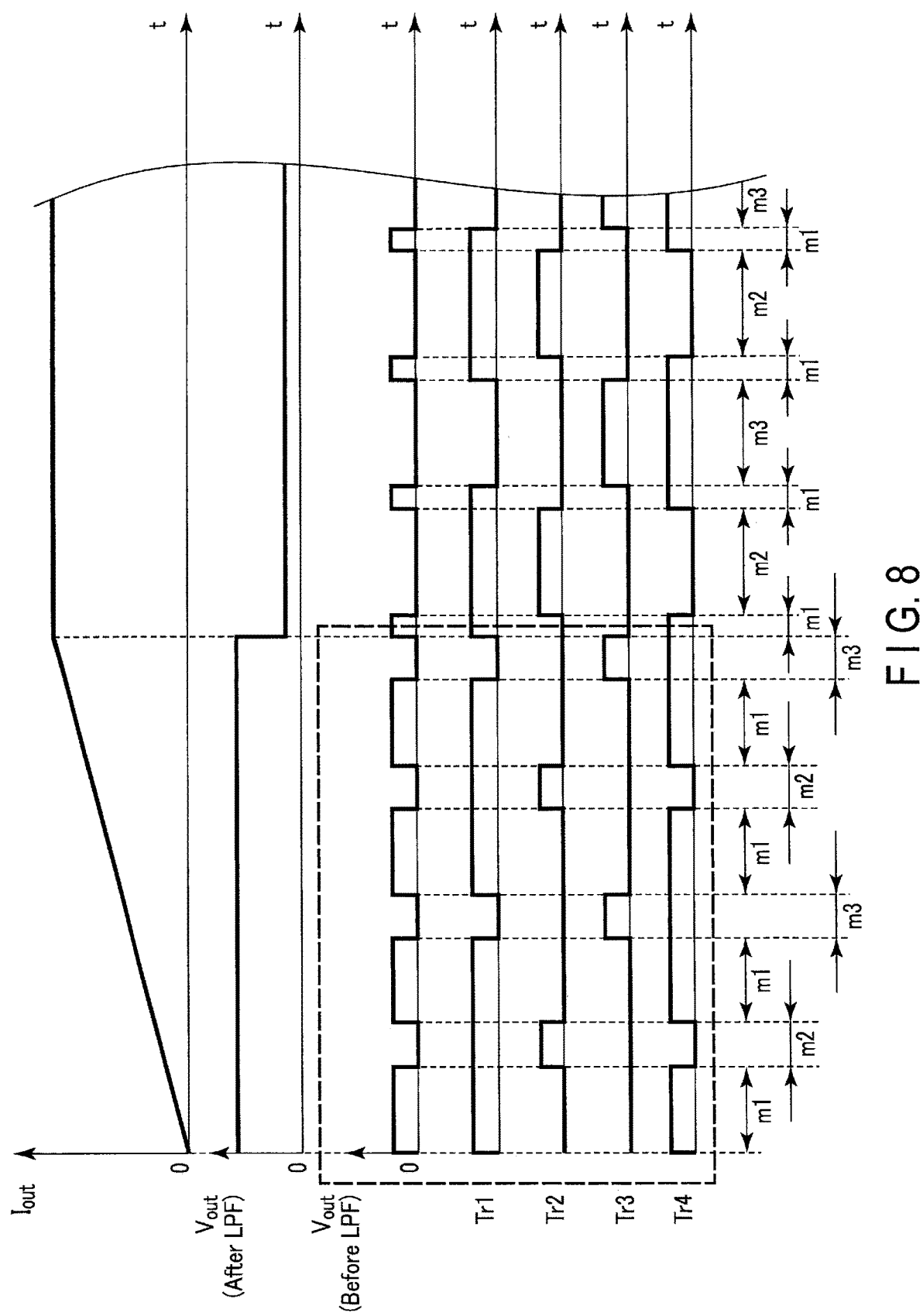
FIG. 8 is a time chart for describing the operations of transistors relating to an output voltage applied to a gradient coil and a current occurring due to the output voltage.

Hereinafter, by way of example, PWM control in a case in which a gradient magnetic field waveform is trapezoidal will be described. FIG. 8 is a time chart illustrating output voltages $V_{out}$ (before LPF and after LPF) from the amplifier 133 and ON/OFF switchings of the transistors (Tr1, Tr2, Tr3, Tr4) in a period in which a current $I_{out}$ increases and in a period in which the current $I_{out}$ is constant. These periods are included in a period during which a current of a positive-directional trapezoidal waveform is supplied to the gradient coil 102.

In the PWM control, in the switching cycles by the switching elements, the peak value of the output voltage $V_{out}$ before the input to the LPF 135 is controlled by the pulse width of the execution time (ON time) of the first mode m1 and fourth mode m4 and by the pulse width of the execution time (OFF time) of the second mode m2 and third mode m3. The LPF 135 is provided at the rear stage of the amplifier 133 in order to demodulate the waveform of the control signal which was modulated by the PWM control.

As illustrated in FIG. 8, since the gradient coil 102 is the inductive load, a large voltage in the positive direction is needed during the period in which the current $I_{out}$ increases from 0 to a constant current value Ic. Hereinafter, in the waveform of the current $I_{out}$ in the load part LP in the generation period of the gradient magnetic field, the period in which the value of the current $I_{out}$ varies away from 0 is referred to as "rising period". The rising period is not limited to the above-described period of increase, but includes, for example, a period in which the current $I_{out}$ decreases from 0 to a constant current value −Ic.

As illustrated in FIG. 8, in the rising period, the execution time of the first mode m1 is longer than each of the execution time of the second mode m2 and the execution time of the third mode m3. Thus, in the rising period, the frequency of application of voltage in the positive direction is high. Hence, in the first mode m1, the voltage $V_{out}$ is applied to the load part LP in the positive direction. At this time, the current $I_{out}$ by the output voltage $V_{out}$ increases with time. Specifically, the rising period corresponds to a period in which electric power is charged in the gradient coil 102. In the second mode m2 and third mode m3, as indicated by thick lines in FIG. 6 and FIG. 7, a current loop is formed such that the power supply 1333 is cut off from the gradient coil 102. Thus, in the second mode m2 and third mode m3, if the LPF 135 is absent, the current $I_{out}$ does not increase and is kept at a constant value. To be more specific, the current $I_{out}$ is slightly attenuated by a resistance component in the gradient coil 102.

Figure 9:
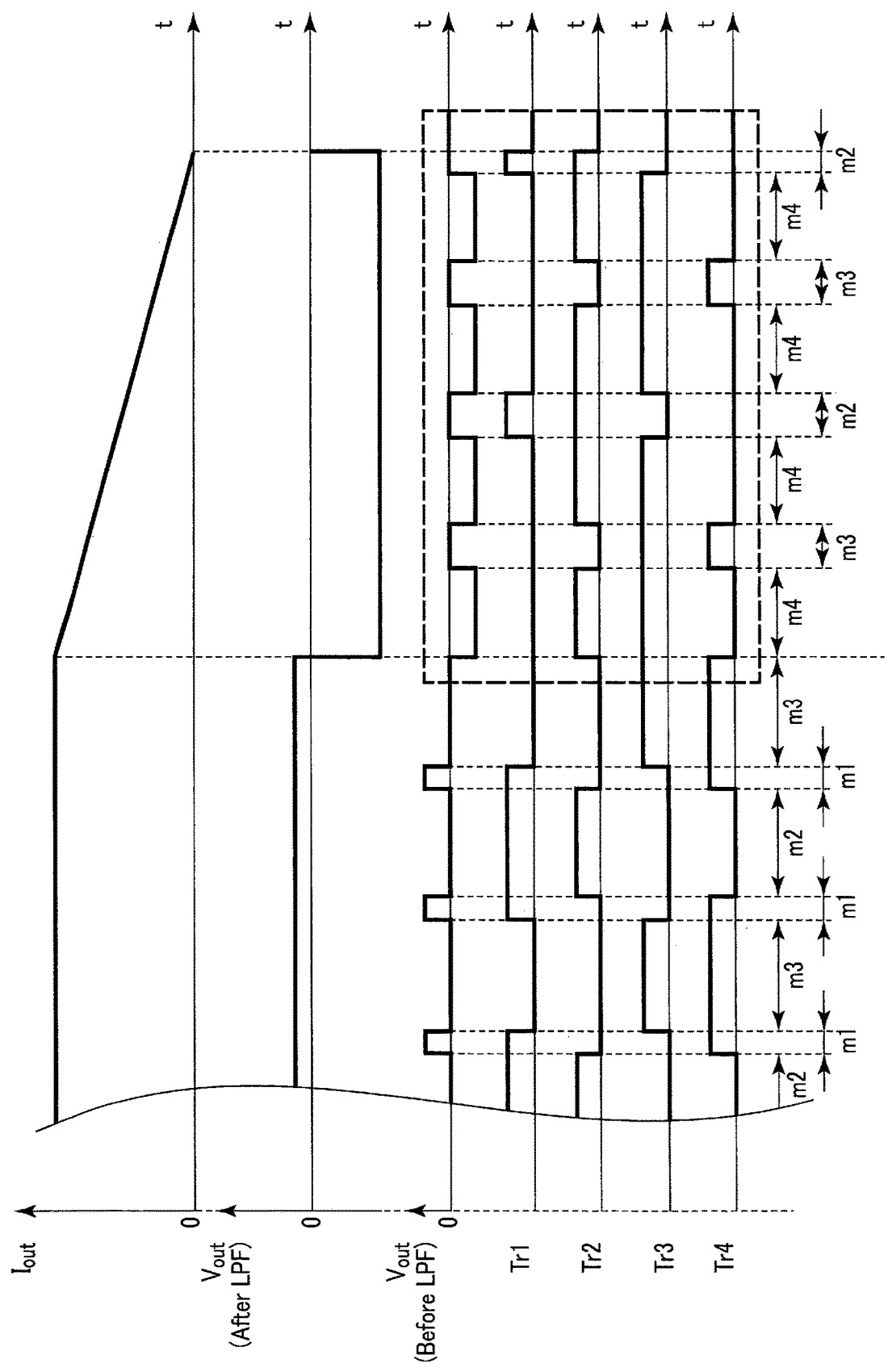
FIG. 9 is a time chart for describing the operations of the transistors relating to the output voltage applied to the gradient coil and the current occurring due to the output voltage.

FIG. 9 is a time chart illustrating output voltages $V_{out}$ (before LPF and after LPF) from the amplifier 133 and ON/OFF switchings of the transistors (Tr1, Tr2, Tr3, Tr4) in a period in which the current $I_{out}$ decreases and in a period in which the current $I_{out}$ is constant. These periods are included in the period during which the current of the positive-directional trapezoidal waveform is supplied to the gradient coil 102. As illustrated in FIG. 9, since the gradient coil 102 is the inductive load, a large voltage in the negative direction is needed during the period in which the current $I_{out}$ decreases from the constant current value Ic to 0. Hereinafter, in the waveform of the current $I_{out}$ in the load part LP in the generation period of the gradient magnetic field, the period in which the value of the current $I_{out}$ approaches 0 is referred to as "falling period". The falling period is not limited to the above-described period of decrease, but includes, for example, a period in which the current $I_{out}$ increases from the constant current value −Ic to 0.

As illustrated in FIG. 9, in the falling period, the execution time of the fourth mode m4 is longer than each of the execution time of the second mode m2 and the execution time of the third mode m3. Thus, in the falling period, the frequency of application of voltage in the negative direction is high. Hence, in the fourth mode m4, the voltage $V_{out}$ is applied to the load part LP in the negative direction. At this time, the current $I_{out}$ by the output voltage $V_{out}$ decreases with time. Specifically, the falling period corresponds to a period in which the energy charged in the gradient coil 102 is released. In the second mode m2 and third mode m3, as indicated by thick lines in FIG. 6 and FIG. 7, a current loop is formed such that the power supply 1333 is cut off from the gradient coil 102.

(Influence of Dead Time)

In the time charts in FIG. 8 and FIG. 9, the transistor Tr3 is ON/OFF switched at the timing when the transistor Tr1 is ON/OFF switched. In addition, the transistor Tr4 is ON/OFF switched at the timing when the transistor Tr2 is ON/OFF switched. These switchings occur due to the fact that the transistor Tr1 and transistor Tr3 are connected in series to the power supply 1333 and that the transistor Tr2 and transistor Tr4 are connected in series to the power supply 1333.

Specifically, in the PWM control, in order to prevent a current loop, which short-circuits the power supply 1333, from being formed by the simultaneous ON state of the transistor Tr1 and transistor Tr3 and the simultaneous ON state of the transistor Tr2 and transistor Tr4, the switching of the transistors is controlled such that the transistor Tr1 and transistor Tr3 do not simultaneously enter the ON state and that the transistor Tr2 and transistor Tr4 do not simultaneously enter the ON state. In the PWM control, in general, a period in which both the transistor Tr1 and transistor Tr3 enter the OFF state and a period in which both the transistor Tr2 and transistor Tr4 enter the OFF state are provided in order to prevent the occurrence of short-circuit of the power supply 1333, by taking into account a switching period from the ON state to OFF state of the transistors and a switching period from the OFF state to ON state of the transistors. Such periods are referred to as "dead times".

Figure 10:
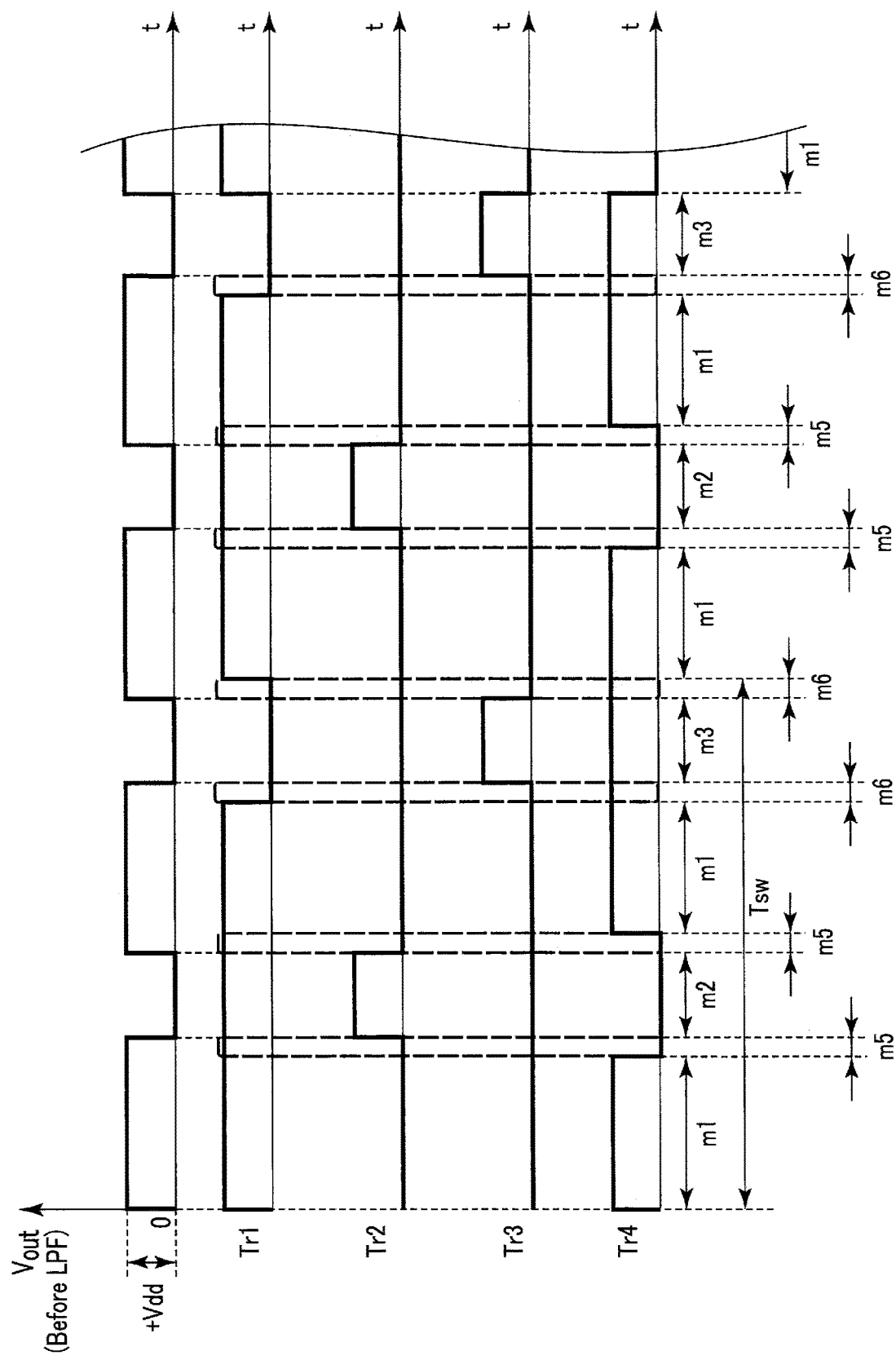
FIG. 10 is an enlarged view of a part of a thick broken line in the time chart of FIG. 8, FIG. 10 being a view for describing the ON/OFF operations of the transistors at dead times.

FIG. 10 is an enlarged view of a part of a thick broken line in the time chart of FIG. 8, FIG. 10 being a view for describing the ON/OFF operation of the transistors at the dead time. As illustrated in FIG. 10, at the dead times in the rising period, an operation mode (hereinafter referred to as "fifth mode m5") in which only the transistor Tr1 enters the ON state and an operation mode (hereinafter "sixth mode m6") in which only the transistor Tr4 enters the ON state are executed by the PWM control. Specifically, both the fifth mode m5 and sixth mode m6 are operation modes which are executed in the dead times.

Figure 11:
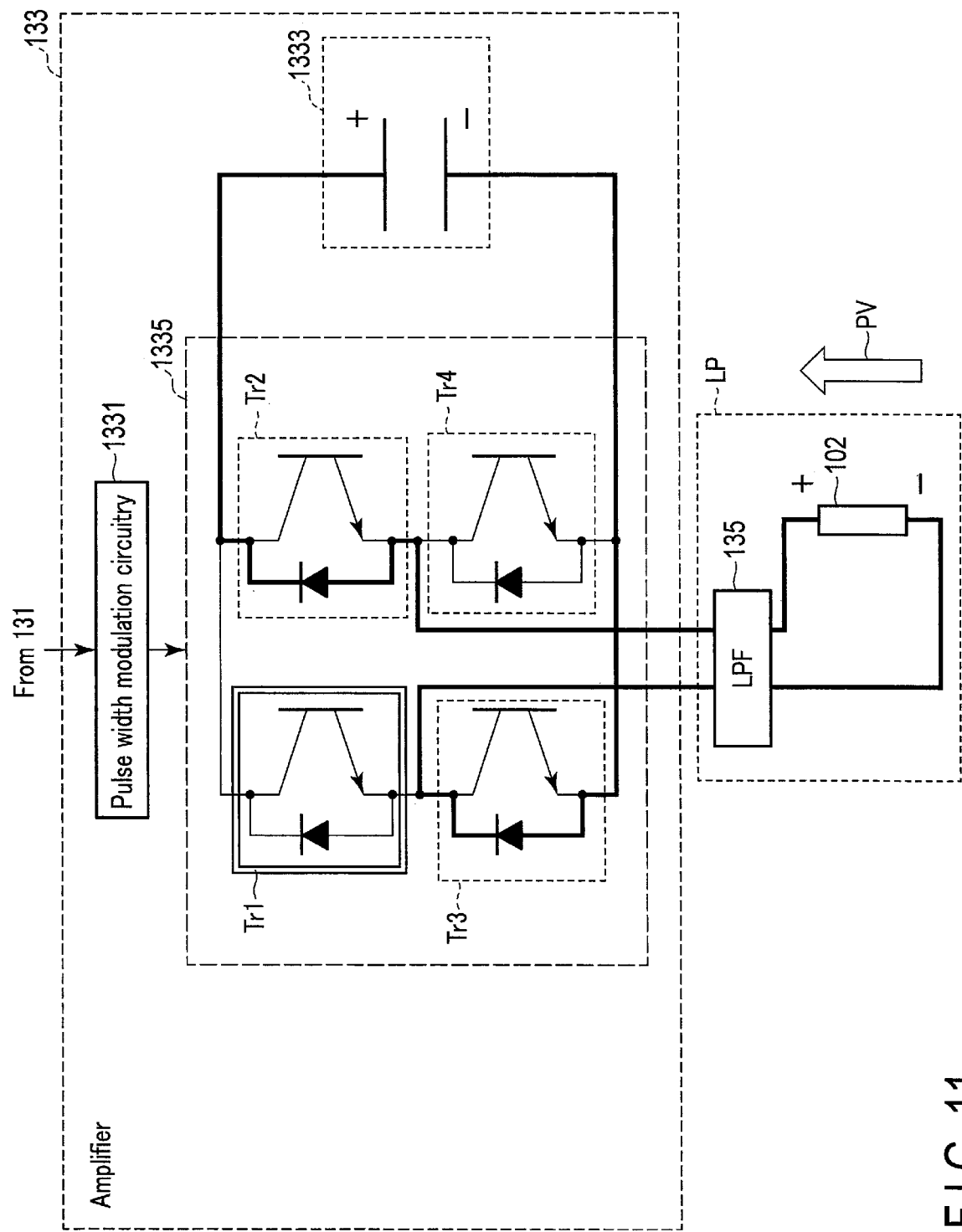

FIG. 11 is a view illustrating the path of an electric current $I_{out}$ (a thick line in FIG. 11) relating to the load part LP together with the direction PV of a positive-directional voltage at the time of the operation of the fifth mode m5 in the rising period. In FIG. 11, the transistor Tr1 surrounded by a double line is indicative of the ON state. FIG. 12 is a view illustrating the path of an electric current $I_{out}$ (a thick line in FIG. 12) relating to the load part LP together with the direction PV of a positive-directional voltage at the time of the operation of the sixth mode m6 in the rising period. In FIG. 12, the transistor Tr4 surrounded by a double line is indicative of the ON state.

As illustrated in FIG. 10, FIG. 11 and FIG. 12, at the dead times that are the execution times of the fifth mode m5 and sixth mode m6, the current $I_{out}$ due to the load part LP tries to keep the positive-directional voltage PV because of the rising period. Thus, the path of the current $I_{out}$ relating to the load part LP becomes a current loop in which the current $I_{out}$ flows back to the power supply 1333 through the regenerative diode relating to the transistor Tr2 and the regenerative diode relating to the transistor Tr3. Specifically, in the current loops of FIG. 11 and FIG. 12, if consideration is given to the application of the voltage to the load part LP with the power supply 1333 being set as the starting point, it turns out that the voltage is applied in a direction opposite to the direction of the current $I_{out}$ in the load part LP.

Figure 13:
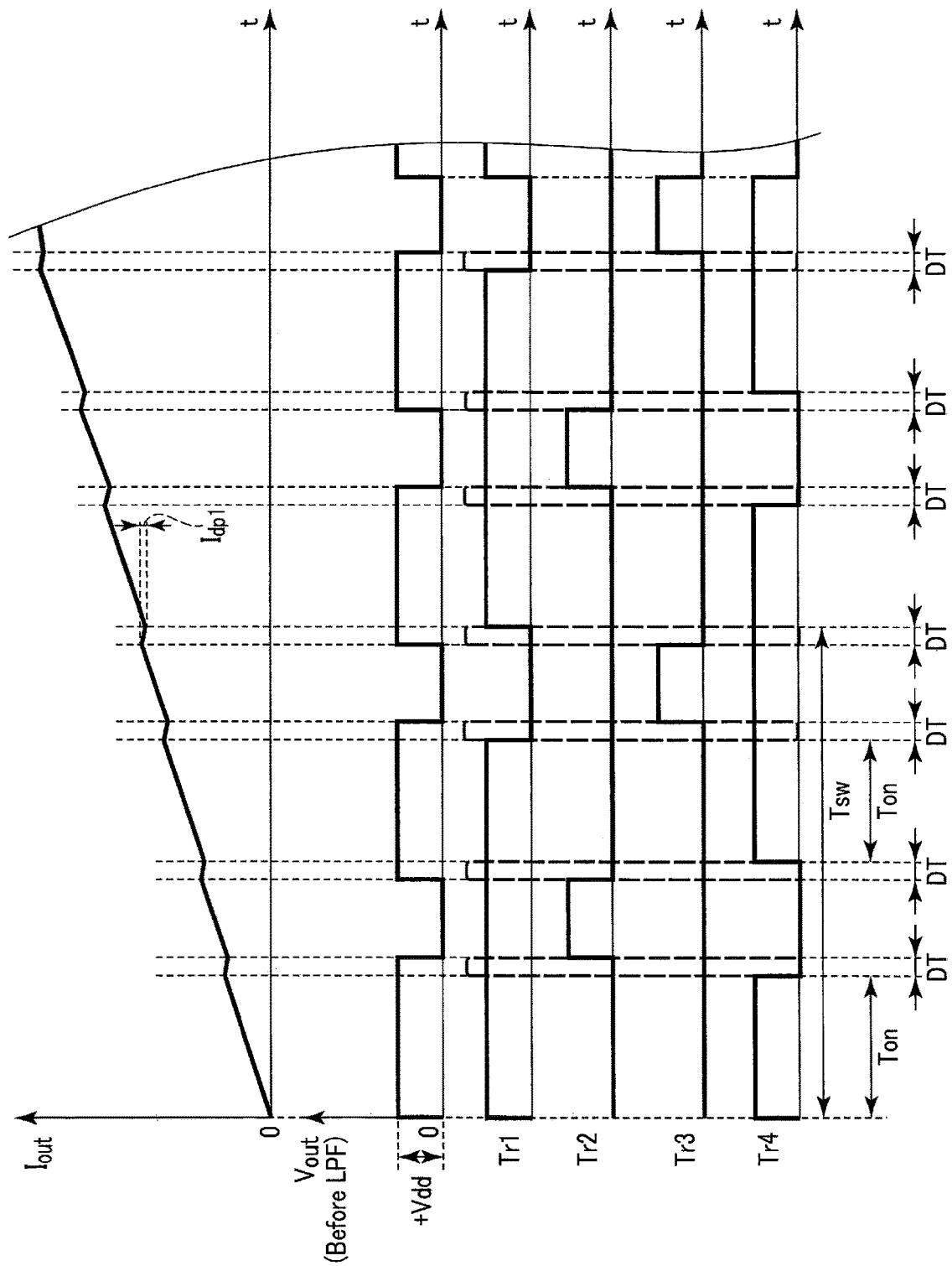
FIG. 13 is a view illustrating a manner of variation of the current in FIG. 8 along with an influence by the dead times.

FIG. 13 is a view illustrating a manner of variation of the current $I_{out}$ in FIG. 8 along with an influence by the dead time. As illustrated in FIG. 13, the current $I_{out}$ decreases by $I_{dp1}$ at the timing of the dead times DT in which the fifth mode m5 and sixth mode m6 are executed.

Figure 14:
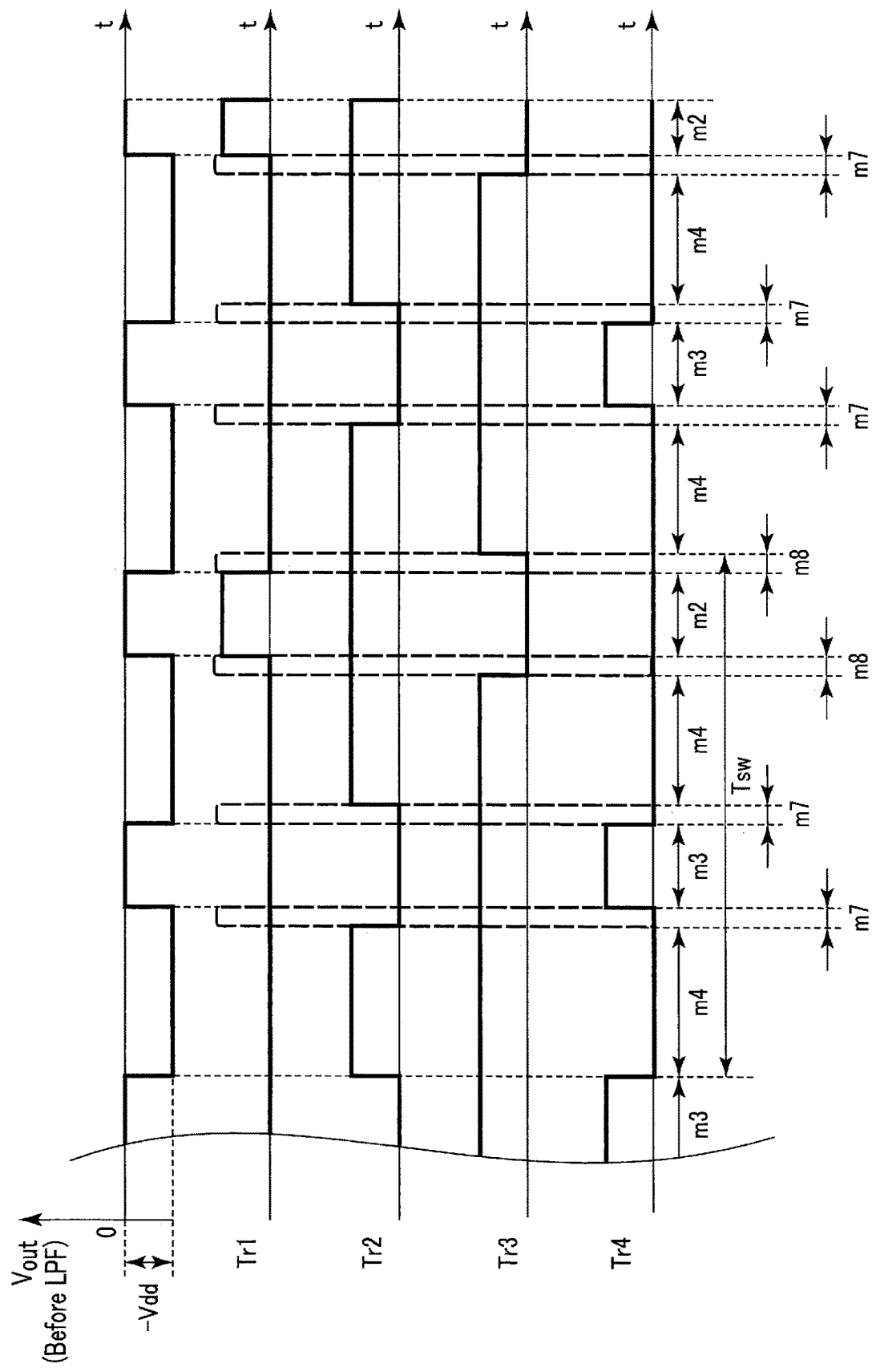
FIG. 14 is an enlarged view of a part of a thick broken line in the time chart of FIG. 9, FIG. 14 being a view for describing the ON/OFF operations of the transistors at dead times.

FIG. 14 is an enlarged view of a part of a thick broken line in the time chart of FIG. 9, FIG. 14 being a view for describing the ON/OFF operation of the transistors at the dead times DT. As illustrated in FIG. 14, at the dead times DT in the falling period, an operation mode (hereinafter referred to as "seventh mode m7") in which only the transistor Tr3 enters the ON state and an operation mode (hereinafter "eighth mode m8") in which only the transistor Tr2 enters the ON state are executed by the PWM control.

Figure 15:
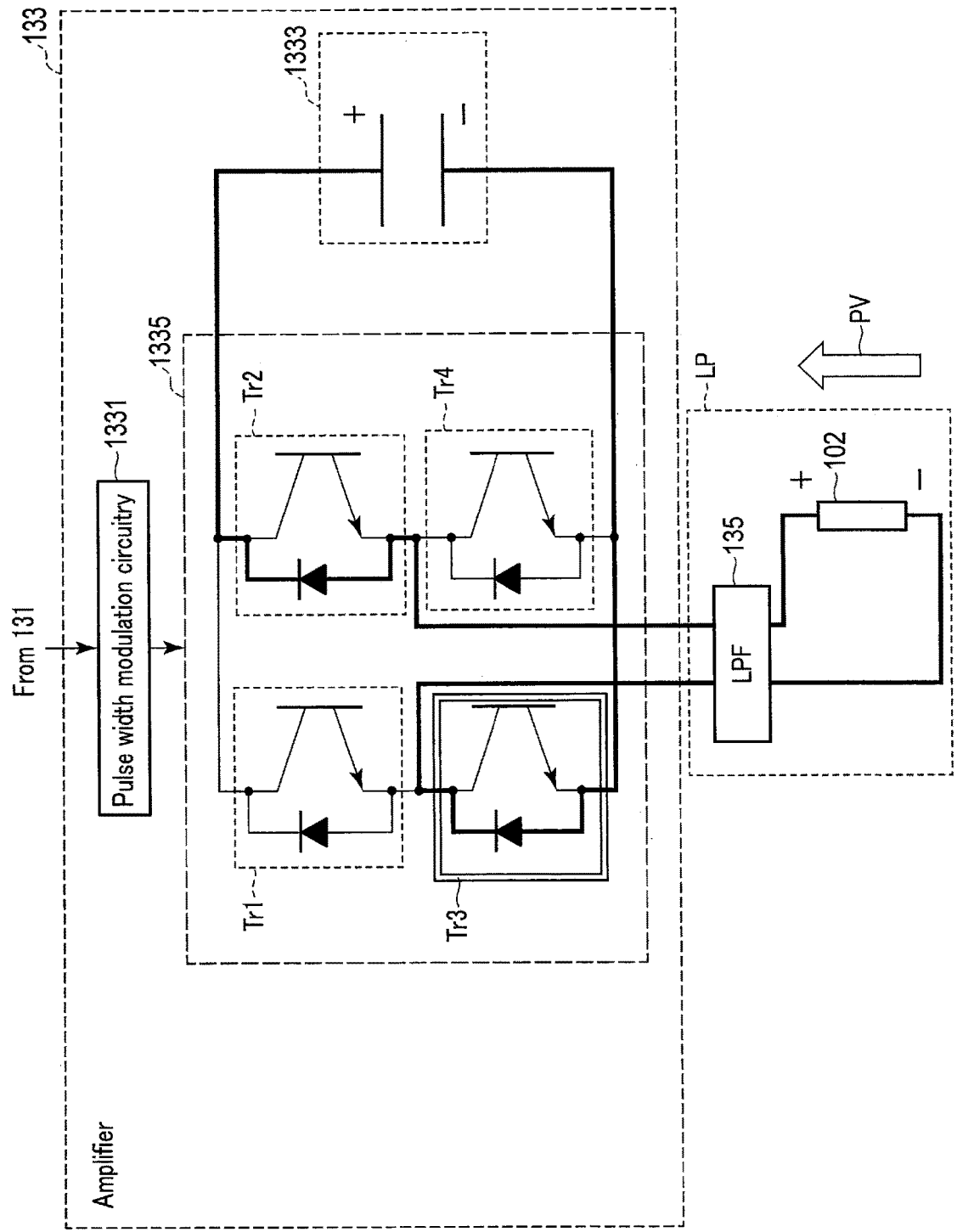

FIG. 15 is a view illustrating the path of an electric current $I_{out}$ (a thick line in FIG. 15) relating to the load part LP together with the direction PV of a positive-directional voltage at the time of the operation of the seventh mode m7 in the falling period. In FIG. 15, the transistor Tr3 surrounded by a double line is indicative of the ON state. FIG. 16 is a view illustrating the path of an electric current $I_{out}$ (a thick line in FIG. 16) relating to the load part LP together with the direction PV of a positive-directional voltage at the time of the operation of the eighth mode m8 in the falling period. In FIG. 16, the transistor Tr2 surrounded by a double line is indicative of the ON state.

As illustrated in FIG. 14, FIG. 15 and FIG. 16, at the dead times that are the execution times of the seventh mode m7 and eighth mode m8, the current $I_{out}$ due to the load part LP tries to flow back to the power supply 1333 because of the falling period. Thus, the path of the current $I_{out}$ relating to the load part LP becomes a current loop in which the current $I_{out}$ flows back to the power supply 1333 through the regenerative diode relating to the transistor Tr2 and the regenerative diode relating to the transistor Tr3. Specifically, in the current loops of FIG. 15 and FIG. 16, if consideration is given to the application of the voltage to the load part LP with the power supply 1333 being set as the starting point, it turns out that the voltage is applied in a direction opposite to the direction of the current $I_{out}$ in the load part LP.

Figure 17:
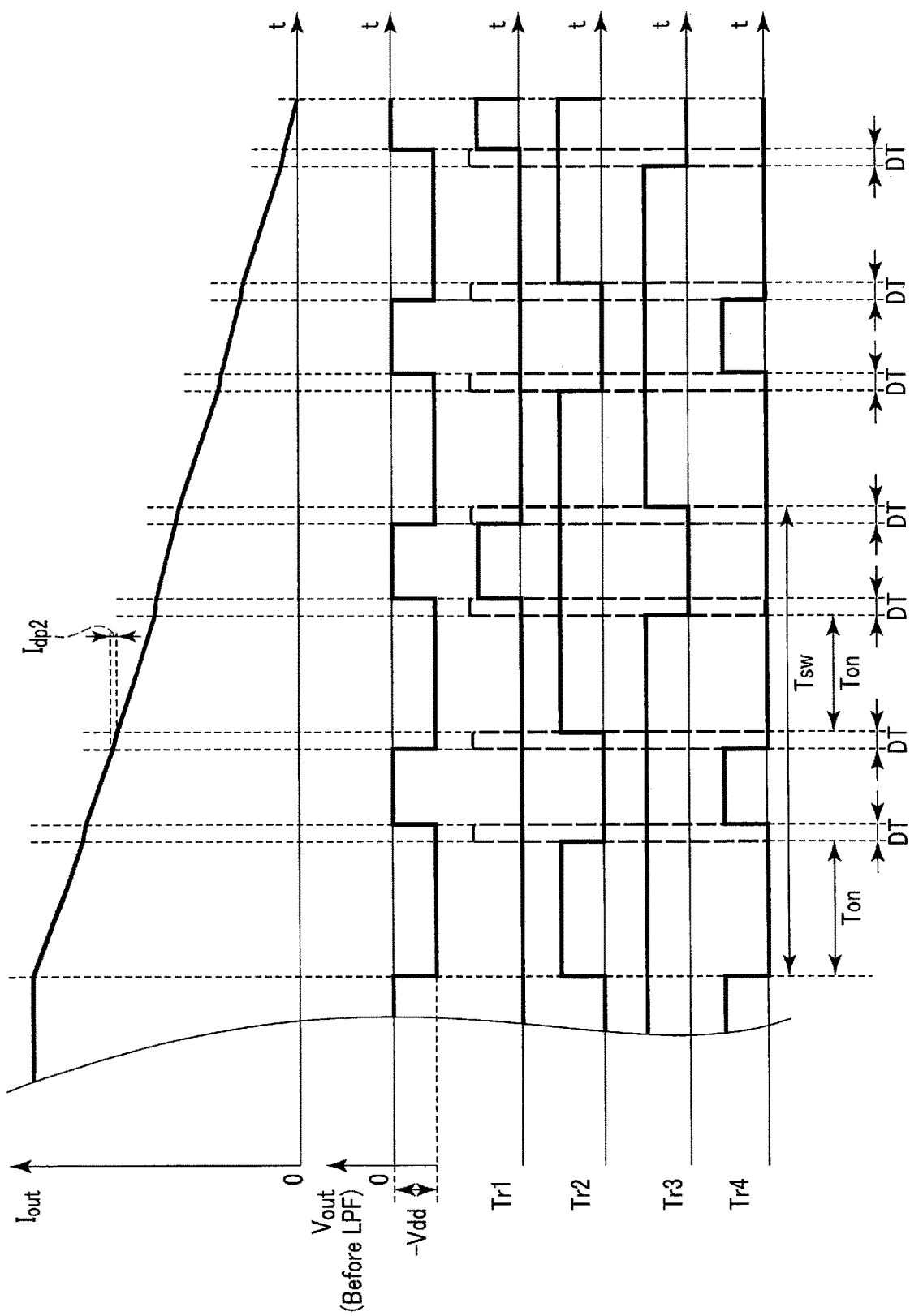
FIG. 17 is a view illustrating a manner of variation of the current in FIG. 9 along with an influence by the dead times.

FIG. 17 is a view illustrating a manner of variation of the current $I_{out}$ in FIG. 9 along with an influence by the dead time DT. As illustrated in FIG. 17, the current $I_{out}$ decreases by $I_{dp2}$ at the timing of the dead times DT in which the seventh mode m7 and eighth mode m8 are executed.

If the operation modes (fifth mode m5 and sixth mode m6) of the transistors in the rising period and the operation modes (seventh mode m7 and eighth mode m8) of the transistors in the falling period are compared, the directions and paths of the current $I_{out}$ at the dead times DT by the PWM control are identical as indicated by the thick line in FIG. 11, the thick line in FIG. 12, the thick line in FIG. 15 and the thick line in FIG. 16.

In the period of the dead time occurring due to the PWM control on the full bridge circuitry 1335, the transistor relating to short-circuit in the full bridge circuitry 1335 is in the OFF state. At this time, the gradient coil 102, which is the load part LP of the gradient magnetic field power supply 129 that is the comparative example, is the inductive load. Thus, even if the transistor relating to short-circuit in the full bridge circuitry 1335 enters the OFF state, the regenerative current continues to flow in the full bridge circuitry 1335, as illustrated in FIG. 11, FIG. 12, FIG. 15 and FIG. 16. This regenerative current forms a current loop so as to flow back to the power supply 1333 that is connected to the full bridge circuitry 1335 via the regenerative diodes connected in parallel to the transistors of the full bridge circuitry 1335, or in other words, so as to return the energy stored in the gradient coil 102 to the power supply 1333.

However, the manner of variation of the current $I_{out}$ flowing in the load part LP is different between the rising period and the falling period. Specifically, in the dead time DT in the rising period (the period of amplification of the current $I_{out}$ supplied to the gradient coil 102), the amplification of the current $I_{out}$ is suppressed as illustrated in FIG. 13. On the other hand, in the dead time DT in the falling period (the period of attenuation of the current $I_{out}$ supplied to the gradient coil 102), the attenuation of the current $I_{out}$ is promoted as illustrated in FIG. 17. As a result, in the rising period and falling period, the contribution to the PWM control in the dead time varies. Specifically, in the rising period and falling period, the loop gain in the feedback control varies, and the manner of variation of the current $I_{out}$ flowing in the load part LP varies. Hence, when the PWM control is executed such that the current $I_{out}$ becomes a trapezoidal wave, a difference occurs in variation of current waveform between the rising period and falling period, and thus the temporal symmetry of the waveform of current supplied to the load part LP is broken.

In the magnetic resonance imaging apparatus 100, a distortion of the waveform of the current $I_{out}$, which is output to the gradient coil 102 from the gradient magnetic field power supply 129 that is the comparative example, greatly affects the quality of the image generated by the image generation function 152. It is thus necessary that a current waveform, which has as high as possible symmetry, be generated. As illustrated in FIG. 13 and FIG. 17, in the PWM control in the gradient magnetic field power supply 129 that is the comparative example, even if the execution time of the first mode m1 in the rising period and the execution time of the fourth mode m4 in the falling period are equal in time interval, the influence on the current waveform due to the dead times DT is different. Hereinafter, the influence on the current waveform due to the dead times DT will be described. For the purpose of simple description, it is assumed that the execution time of the first mode m1 in the rising period and the execution time of the fourth mode m4 in the falling period are equal in time interval. In addition, it is assumed that the dead time in the rising period and the dead time in the falling period are equal in time interval.

An absolute value $V_{out\_rise}$ of the output voltage in the rising period in which the direction of the current $I_{out}$ and the direction of the voltage $V_{out}$ are identical is expressed by the following equation by using, as illustrated in FIG. 12 and FIG. 13, with respect to each switching cycle Tsw in the PWM control, a power supply voltage (Vdd) of the power supply 1333, a ratio (Ton/Tsw) of a total time Ton of execution of the first mode m1 to the switching cycle Tsw, and a ratio (4×DT/Tsw: hereinafter referred as "dead time ratio") of a total time (4×DT) of the dead times DT to the switching cycle Tsw:

$$V_{out\_rise} = Vdd \times (Ton/Tsw) - Vdd \times (4 \times DT/Tsw).$$

Specifically, the absolute value $V_{out\_rise}$ of the output voltage in the rising period is a value obtained by subtracting the product of the power supply voltage (Vdd) and dead time ratio (4×DT/Tsw) from the product of the power supply voltage (+Vdd) and ratio (Ton/Tsw).

On the other hand, an absolute value $V_{out\_fall}$ of the output voltage in the falling period in which the direction of the current $I_{out}$ and the direction of the voltage $V_{out}$ are different is expressed by the following equation by using, as illustrated in FIG. 16 and FIG. 17, with respect to each switching cycle Tsw in the PWM control, the power supply voltage (Vdd) of the power supply 1333, the ratio (Ton/Tsw) of the total time (Ton) of execution of the fourth mode m4 to the switching cycle Tsw, and the dead time ratio (4×DT/Tsw):

$$V_{out\_fall} = Vdd \times (Ton/Tsw) + Vdd \times (4 \times DT/Tsw).$$

Specifically, the absolute value $V_{out\_fall}$ of the output voltage in the falling period is a value obtained by adding the product of the power supply voltage (Vdd) and ratio (Ton/Tsw) and the product of the power supply voltage (Vdd) and dead time ratio (4×DT/Tsw).

Hence, the absolute value $V_{out\_fall}$ of the output voltage in the falling period is greater than the absolute value $V_{out\_rise}$ of the output voltage in the rising period by eight times the product of the ratio (DT/Tsw) of the dead time DT to the switching cycle Tsw and the power supply voltage Vdd of the power supply 1333. Specifically, with respect to each switching cycle, the difference ($V_{out\_fall} - V_{out\_rise}$: hereinafter referred to as "differential voltage") between the absolute value $V_{out\_fall}$ of the output voltage in the falling period and the absolute value $V_{out\_rise}$ of the output voltage in the rising period is expressed by $$V_{out\_fall} - V_{out\_rise} = 8 \times Vdd \times (DT/Tsw).$$

Specifically, the differential voltage is the value obtained by multiplying the product of the ratio (DT/Tsw) of the dead time DT to switching cycle Tsw and the power supply voltage Vdd by double the total number of dead times DT in the switching cycle Tsw.

The above differential voltage in the PWM control is a cause of symmetry breaking of the current waveform, and appears as a difference in gain of the output voltages $V_{out}$ to the control signal in the amplifier 133. Hereinafter, a description is given of the decreasing of the differential voltage, that is, the enhancing of the symmetry of the current waveform, in the magnetic resonance imaging apparatus 100 relating to the present embodiment. FIG. 18 is a block diagram illustrating the configuration of the gradient magnetic field power supply 130 in the present embodiment.

The gradient coil 102 generates a gradient magnetic field by the current $I_{out}$ supplied in accordance with the output voltage $V_{out}$ which is output from the amplifier 133 including the pulse width modulation circuitry 1331.

The gradient magnetic field power supply 130 includes feedback control circuitry 131, adjusting circuitry 132, amplifier 133 and LPF 135. The amplifier 133 includes pulse width modulation circuitry 1331, full bridge circuitry 1335 and a power supply (not shown). Specifically, the amplifier 133 includes pulse width modulation circuitry which modulates the pulse widths of driving signals, which are input to the plural switching elements, in accordance with the input of the control signal corresponding to the waveform of the gradient magnetic field.

The feedback control circuitry 131 executes feedback control on the input signal $I_{in}$ by using the value of the current $I_{out}$, and outputs a control signal to the adjusting circuitry 132. The feedback control circuitry 131 corresponds to a feedback controller and is realized by the above-described processor, etc.

The pulse width modulation circuitry 1331 modulates the pulse widths of driving signals, which are input to the plural switching elements, in accordance with control signals of the switching elements, the control signals being based on the input signal $I_{in}$ corresponding to the waveform of the gradient magnetic field. The pulse width modulation circuitry 1331 corresponds to a pulse width modulator and is realized by the above-described processor, etc.

The adjusting circuitry 132 executes adjustment of the gain of the amplifier 133, which is included in the control signal, or adjustment of the pulse width of the driving signal, in accordance with the dead times included in the switching cycle of the switching elements. Specifically, the adjusting circuitry 132 adjusts the gain of the amplifier 133 or the pulse width of the driving signal, such that the waveform of the gradient magnetic field becomes a symmetric waveform between the rising and falling. For example, the adjusting circuitry 132 adjusts the gain of the control signal in accordance with the ratio of the dead time to the switching cycle. In addition, the adjusting circuitry 132 adjusts the amount of decrease of the pulse width in accordance with the length of the dead time.

To be more specific, the adjusting circuitry 132 adjusts the gain of the control signal, based on the ratio (DT/Tsw) of the dead time DT of the switching element to the switching cycle Tsw of the switching element, or adjusts the pulse width in the pulse width modulation, based on the dead time DT. Concretely, the adjusting circuitry 132 calculates the product ($I_{in} \times dI_{in}/dt$) of a time differential ($dI_{in}/dt$) of the input signal $I_{in}$ by PID control and the input signal $I_{in}$. The adjusting circuitry 132 judges that, in the period during which the input signal $I_{in}$ is being output to the feedback control circuitry 131, a period in which the product ($I_{in} \times dI_{in}/dt$) is negative is a falling period in which the value of the current $I_{out}$ approaches zero in the waveform of the current $I_{out}$. During the falling period, the adjusting circuitry 132 executes adjustment of the gain for the control signal or adjustment of the pulse width of the driving signal, which contributes to the attenuation of the current $I_{out}$. To be more specific, as the adjustment of the gain for the control signal, the adjusting circuitry 132 imparts a differential value to the control signal as a gain, the differential value being obtained by subtracting from 1 an integrated value between double the total number of dead times DT in the switching cycle Tsw and the dead time ratio. Incidentally, as the adjustment of the pulse width, instead of imparting the gain to the control signal, the adjusting circuitry 132 may decrease the pulse width of the driving signal contributing to the attenuation of the current $I_{out}$, by double the integrated value of the dead time DT in the switching cycle Tsw. The adjusting circuitry 132 corresponds an adjusting unit and is realized by the above-described processor, etc.

The full bridge circuitry 1335 applies, in the rising period or falling period, the output voltage $V_{out}$ to the gradient coil 102 in accordance with the pulse width modulated according to the adjusted control signal, or in accordance with the adjusted pulse width.

(Adjusting Function)

Figure 19:
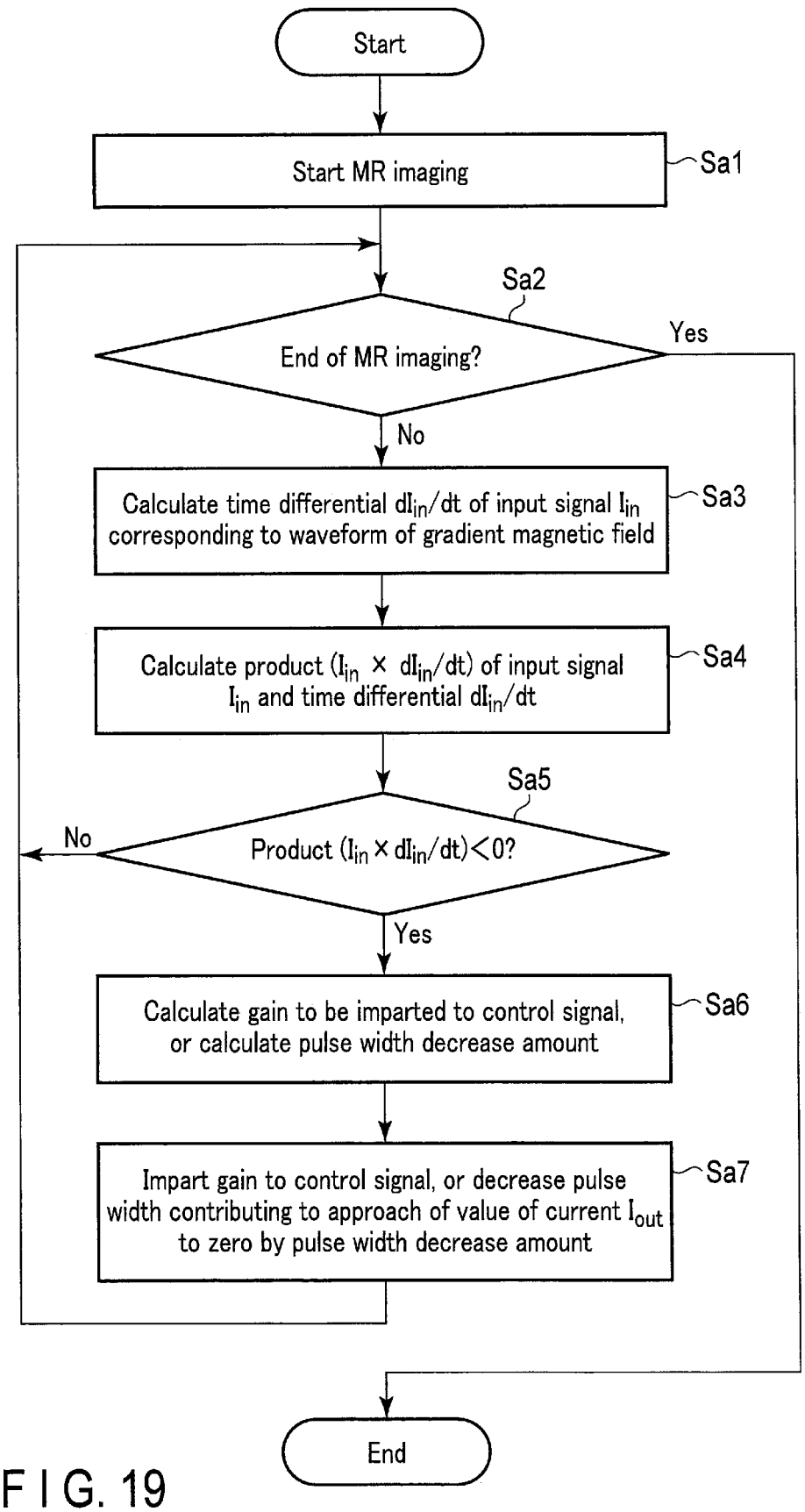
FIG. 19 is a flowchart illustrating an example of a process procedure in an adjusting function in the embodiment.

The adjusting function is a function of adjusting the control signal in the falling period, or adjusting the pulse width in the falling period. FIG. 19 is a flowchart illustrating an example of a process procedure in the adjusting function. Hereinafter, for the purpose of simple description, it is assumed that the execution time of the first mode m1 in the rising period and the execution time of the fourth mode m4 in the falling period are equal in time interval. In addition, it is assumed that the dead times DT before the execution of this adjusting function are equal in time interval in the rising period and in the falling period.

(Step Sa1)

Under the control by the sequence control circuitry 110, MR imaging is started based on the information of an imaging sequence. At this time, the input signal $I_{in}$ corresponding to the waveform of the gradient magnetic field in the imaging sequence is output from the sequence control circuitry 110 to the feedback control circuitry 131 and adjusting circuitry 132 in the gradient magnetic field power supply 130. In addition, when the object of adjustment by the adjusting function is the control signal, the control signal is output from the feedback control circuitry 131 to the adjusting circuitry 132.

(Step Sa2)

If the MR imaging does not end, the process of step Sa3 is executed.

(Step Sa3)

In the feedback control circuitry 131, the time differential $dI_{in}/dt$ of the input signal $I_{in}$ is calculated. The calculated time differential $dI_{in}/dt$ is output to the adjusting circuitry 132.

(Step Sa4)

In the adjusting circuitry 132, the product ($I_{in} \times dI_{in}/dt$) of the input signal $I_{in}$ and the time differential $dI_{in}/dt$ of the input signal $I_{in}$ is calculated.

(Step Sa5)

The product ($I_{in} \times dI_{in}/dt$) calculated by the adjusting circuitry 132 is compared with 0. If the product ($I_{in} \times dI_{in}/dt$) of the input signal $I_{in}$ and the time differential $dI_{in}/dt$ of the input signal $I_{in}$ is not less than 0 (No in step Sa5), the processes of step Sa2 to step Sa4 are repeated. At this time, the output voltage $V_{out}$ by the PWM control on the control signal is applied to the gradient coil 102.

If the product ($I_{in} \times dI_{in}/dt$) of the input signal $I_{in}$ and the time differential $dI_{in}/dt$ of the input signal $I_{in}$ is negative (Yes in step Sa5), the process of step Sa6 is executed. That the product ($I_{in} \times dI_{in}/dt$) is negative corresponds to the fact that the time point when the control signal was input to the pulse width modulation circuitry 1331 belongs to the falling period.

(Step Sa6)

The gain to be imparted to the control signal, or the amount (hereinafter referred to as "pulse width decrease amount") by which the pulse width of the driving signal contributing to the attenuation of the current $I_{out}$ is decreased, is calculated by the adjusting circuitry 132.

Hereinafter, referring to FIG. 17 by way of example, the calculation of the gain relating to the adjustment of the control signal will be concretely described. The total number of dead times included in the first switching cycle Tsw in the falling period in FIG. 17 is 4. Thus, the adjusting circuitry 132 calculates the gain (1−8× DT/Tsw) which is to be imparted to the control signal, by subtracting from 1 the product of 8, i.e. double the total number 4 of dead times included in the first switching cycle Tsw, and the dead time ratio (DT/Tsw). In addition, the total number of dead times included in the next switching cycle in the falling period in FIG. 17 is 3. Thus, the adjusting circuitry 132 calculates the gain (1−6×DT/Tsw) which is to be imparted to the control signal, by subtracting from 1 the product of 6, i.e. double the total number 3 of dead times included in the next switching cycle, and the dead time ratio (DT/Tsw).

Next, referring to FIG. 17 by way of example, the calculation of the pulse width decrease amount will be concretely described. The total number of dead times included in the first switching cycle Tsw in the falling period in FIG. 17 is 4. Thus, the adjusting circuitry 132 calculates the product of 8, i.e. double the total number 4 of dead times included in the first switching cycle Tsw, and the dead time DT, that is, calculates the pulse width decrease amount (8×DT), i.e. double the integrated value 4×DT of the dead time DT in the first switching cycle. The total number of dead times included in the next switching cycle in the falling period in FIG. 17 is 3. Thus, the adjusting circuitry 132 calculates the pulse width decrease amount (6×DT), that is, the product of 6, i.e. double the total number 3 of dead times included in the next switching cycle, and the dead time DT.

(Step Sa1)

The adjustment of the gain for the control signal, or the adjustment of the pulse width of the driving signal contributing to the attenuation of the current $I_{out}$, is executed by the adjusting circuitry 132. To begin with, the adjustment of the gain for the control signal is described. The adjusting circuitry 132 imparts the calculated gain (1−8×DT/Tsw) to the control signal in the first switching cycle Tsw in the falling period. Next, the adjusting circuitry 132 imparts the calculated gain (1−6×DT/Tsw) to the control signal. By these processes, the gain in the amplifier 133 decreases in the falling period. Therefore, the waveform of the current $I_{out}$ in the falling period can be made closer to the waveform of the current $I_{out}$ in the rising period.

Next, the adjustment of the pulse width of the driving signal contributing to the attenuation of the current $I_{out}$ is described. In the first switching cycle Tsw in the falling period, the adjusting circuitry 132 decreases the pulse width (the pulse width of the fourth mode m4) of the driving signal contributing to the attenuation of the current $I_{out}$, by the calculated pulse width decrease amount (8×DT). Then, the adjusting circuitry 132 decreases the pulse width of the fourth mode m4 in the next switching cycle by the calculated pulse width decrease amount (6×DT). By these processes, the pulse width of the fourth mode m4 in the falling period decreases by the pulse width decrease amount. Therefore, the waveform of the current $I_{out}$ in the falling period can be made closer to the waveform of the current $I_{out}$ in the rising period.

By the adjustment of the gain for the control signal or the adjustment of the pulse width in the present step, the promotion of the attenuation of the current $I_{out}$ in the falling period can be decreased. After the process of step Sa7, the processes of step Sa2 to step Sa7 are repeated until the MR imaging ends (Yes in step Sa2).

According to the above-described configuration, the following advantageous effects can be obtained.

According to the magnetic resonance imaging apparatus 100 of the present embodiment, the pulse widths of the driving signals that are input to the plural switching elements can be modulated in accordance with the control signal of the switching elements, which is based on the input signal $I_{in}$ corresponding to the waveform of the gradient magnetic field, and the gain of the control signal can be adjusted based on the ratio of the dead time DT of the switching element to the switching cycle Tsw of the switching element, or the pulse width of the driving signal contributing to the attenuation of the current $I_{out}$ can be adjusted based on the dead time DT.

In addition, according to the magnetic resonance imaging apparatus 100, this magnetic resonance imaging apparatus 100 includes the gradient coil 102 functioning as the load part LP; the full bridge circuitry which applies the output voltage $V_{out}$ to the gradient coil 102 in accordance with the pulse width modulated according to the adjusted control signal, or in accordance with the adjusted pulse width; and the feedback controller which executes feedback control on the input signal $I_{in}$ by using the value of the current $I_{out}$, and outputs the control signal to the pulse width modulator. In the period during which the input current $I_{in}$ is being output to the feedback controller, a period, in which the product ($I_{in}$×d$I_{in}$/dt) of the time differential (d$I_{in}$/dt) of the input signal $I_{in}$ and the input signal $I_{in}$ is negative, is judged to be the falling period in which the value of the current $I_{out}$ approaches zero in the waveform of the current $I_{out}$, and during the falling period, the adjustment of the gain for the control signal can be executed or the adjustment of the pulse width of the driving signal, which contributes to the attenuation of the current $I_{out}$, can be executed.

To be more specific, according to the magnetic resonance imaging apparatus 100, as the adjustment of the gain in the falling period, a differential value is imparted to the control signal as the gain, the differential value being obtained by subtracting from 1 the integrated value between double the total number of dead times DT in the switching cycle Tsw and the ratio of the dead time DT of the switching element to the switching cycle Tsw of the switching element. As the adjustment of the pulse width in the falling period, the pulse width of the driving signal contributing to the attenuation of the current $I_{out}$ can be decreased by double the integrated value of the dead time DT in the switching cycle Tsw.

From the above, according to the magnetic resonance imaging apparatus 100, in the falling period of the current $I_{out}$, the control amount (the gain of the control signal or the pulse width) in the PWM control is adjusted, and thereby the symmetry of the current waveform (trapezoidal wave) can be improved without deteriorating the dead time DT. Thereby, the quality of the image that is generated by the image generation function 152 can be enhanced.

(First Modification)

The adjusting function in the present modification differs from the adjusting function in the present embodiment in that the control signal is adjusted in the rising period, or the pulse width is adjusted in the rising period.

The adjusting circuitry 132 judges that, in the period during which the input signal $I_{in}$ is being output to the feedback control circuitry 131, a period in which the product ($I_{in}$×d$I_{in}$/dt) is positive is a rising period in which the value of the current varies away from zero in the waveform of the current $I_{out}$. The adjusting circuitry 132 executes the adjustment of the gain or the adjustment of the pulse width over the rising period. Specifically, as the adjustment of the gain in the rising period, the adjusting circuitry 132 imparts to the control signal an integrated value between double the total number of dead times DT in the switching cycle Tsw and the dead time ratio. Incidentally, as the adjustment of the pulse width in the rising period, instead of imparting the gain to the control signal, the adjusting circuitry 132 may increase the pulse width of the driving signal contributing to the amplification of the current $I_{out}$, by double the integrated value of the dead time DT in the switching cycle Tsw.

Hereinafter, as regards the adjusting function in the present modification, processes different from the embodiment in FIG. 19 will be described.

(Adjusting Function)

(Step Sa5)

If the product ($I_{in}$×d$I_{in}$/dt) of the input signal $I_{in}$ and the time differential d$I_{in}$/dt of the input signal $I_{in}$ is positive, the process of step Sa6 is executed. If the product ($I_{in}$×d$I_{in}$/dt) of the input signal $I_{in}$ and the time differential d$I_{in}$/dt of the input signal $I_{in}$ is 0 or less, the processes of step Sa2 to step Sa4 are repeated. At this time, the output voltage $V_{out}$ by the PWM control on the control signal is applied to the gradient coil 102.

(Step Sa6)

The gain to be imparted to the control signal, or the amount (hereinafter referred to as "pulse width increase amount") by which the pulse width of the driving signal contributing to the amplification of the current $I_{out}$ is increased, is calculated by the adjusting circuitry 132.

Hereinafter, referring to FIG. 13 by way of example, the calculation of the gain relating to the adjustment of the control signal will be concretely described. The total number of dead times included in the first switching cycle Tsw in the rising period in FIG. 13 is 4. Thus, the adjusting circuitry 132 calculates the gain (1+8×DT/Tsw), which is imparted to the control signal, by adding 1 to the product of 8, i.e. double the total number 4 of dead times included in the first switching cycle Tsw, and the dead time ratio (DT/Tsw). In addition, the total number of dead times included in the next switching cycle in the rising period in FIG. 13 is 3. Thus, the adjusting circuitry 132 calculates the gain (1+6×DT/Tsw), which is imparted to the control signal, by adding 1 to the product of 6, i.e. double the total number 3 of dead times included in the next switching cycle, and the dead time ratio (DT/Tsw).

Next, referring to FIG. 13 by way of example, the calculation of the pulse width increase amount will be concretely described. The total number of dead times included in the first switching cycle Tsw in the rising period in FIG. 13 is 4. Thus, the adjusting circuitry 132 calculates the product of 8, i.e. double the total number 4 of dead times included in the first switching cycle Tsw, and the dead time DT, that is, calculates the pulse width increase amount (8×DT), i.e. double the integrated value 4×DT of the dead time DT in the first switching cycle. The total number of dead times included in the next switching cycle in the rising period in FIG. 13 is 3. Thus, the adjusting circuitry 132 calculates the pulse width increase amount (6×DT), that is, the product of 6, i.e. double the total number 3 of dead times included in the next switching cycle, and the dead time DT.

(Step Sa7)

The adjustment of the gain for the control signal, or the adjustment of the pulse width of the driving signal contributing to the amplification of the current $I_{out}$, is executed by the adjusting circuitry 132. After the process of step Sa7, the processes of step Sa2 to step Sa7 are repeated until the MR imaging ends (Yes in step Sa2).

The adjustment of the gain for the control signal is described. The adjusting circuitry 132 imparts the calculated gain (1+8×DT/Tsw) to the control signal in the first switching cycle Tsw in the rising period. Next, the adjusting circuitry 132 imparts the calculated gain (1+6×DT/Tsw) to the control signal. Hence, the gain in the amplifier 133 increases in the rising period. Therefore, the waveform of the current $I_{out}$ in the rising period can be made closer to the waveform of the current $I_{out}$ in the falling period.

Next, the adjustment of the pulse width of the driving signal contributing to the amplification of the current $I_{out}$ is described. In the first switching cycle Tsw in the rising period, the adjusting circuitry 132 increases the pulse width (the pulse width of the first mode m1) of the driving signal contributing to the amplification of the current $I_{out}$, by the calculated pulse width increase amount (8×DT). Then, the adjusting circuitry 132 increases the pulse width of the first mode m1 in the next switching cycle by the calculated pulse width increase amount (6×DT). Hence, the pulse width of the first mode m1 in the rising period increases by the pulse width increase amount. Therefore, the waveform of the current $I_{out}$ in the rising period can be made closer to the waveform of the current $I_{out}$ in the falling period.

In the present modification, there is an upper limit to the pulse width increase amount. Specifically, in the switching cycle, the ON time in which the first mode m1 is executed needs to be made less than the pulse width which is calculated by subtracting four times the dead time from the switching cycle. By this adjustment, the suppression of amplification of the current $I_{out}$ in the rising period can be reduced.

In addition, the process in the adjusting function of the present modification can be incorporated in the process in the adjusting function of the present embodiment. In this case, it is possible to further improve the symmetry between the waveform of the current $I_{out}$ in the rising period and the waveform of the current $I_{out}$ in the falling period.

According to the above-described configuration, the following advantageous effects can be obtained.

According to the magnetic resonance imaging apparatus 100 of the present modification, this magnetic resonance imaging apparatus 100 includes the gradient coil 102 functioning as the load part LP; the full bridge circuitry which applies the output voltage $V_{out}$ to the gradient coil 102 in accordance with the pulse width modulated according to the adjusted control signal, or in accordance with the adjusted pulse width; and the feedback controller which executes feedback control on the input signal $I_{in}$ by using the value of the current $I_{out}$, and outputs the control signal to the pulse width modulator. In the period during which the input signal $I_{in}$ is being output to the feedback controller, a period, in which the product ($I_{in} \times dI_{in}/dt$) of the time differential ($dI_{in}/dt$) of the input signal $I_{in}$ and the input signal $I_{in}$ is positive, is judged to be the rising period in which the value of the current $I_{out}$ varies away from zero in the waveform of the current $I_{out}$, and during the rising period, the adjustment of the gain for the control signal can be executed or the adjustment of the pulse width of the driving signal, which contributes to the amplification of the current $I_{out}$, can be executed.

To be more specific, according to the magnetic resonance imaging apparatus 100, as the adjustment of the gain in the rising period, an integrated value is imparted to the control signal as the gain, the integrated value being obtained by an integration between double the total number of dead times DT in the switching cycle Tsw and the ratio of the dead time DT of the switching element to the switching cycle Tsw of the switching element. As the adjustment of the pulse width in the rising period, the pulse width of the driving signal contributing to the amplification of the current $I_{out}$ can be increased by double the integrated value of the dead time DT in the switching cycle Tsw.

From the above, according to the magnetic resonance imaging apparatus 100, in the rising period of the current 'out' the control amount (the gain of the control signal or the pulse width) in the PWM control is adjusted, and thereby the symmetry of the current waveform (trapezoidal wave) can be improved without deteriorating the dead time DT. Thereby, the quality of the image that is generated by the image generation function 152 can be enhanced.

Furthermore, by incorporating the adjusting function of the present modification into the adjusting function of the present embodiment, it becomes possible to further improve the symmetry between the waveform of the current $I_{out}$ in the rising period and the waveform of the current $I_{out}$ in the falling period, and to further enhance the quality of the image generated by MR imaging.

(Second Modification)

The present modification differs from the embodiment in that in the judgment of the rising period or falling period, a product ($I_{out} \times V_{out}$) of the current $I_{out}$ and output voltage $V_{out}$ and a time differential ($dI_{in}/dt$) of the input signal $I_{in}$ are used in place of the product ($I_{in} \times dI_{in}/dt$) of the time differential ($dI_{in}/dt$) of the input signal $I_{in}$ and the input signal $I_{in}$.

Figure 20:
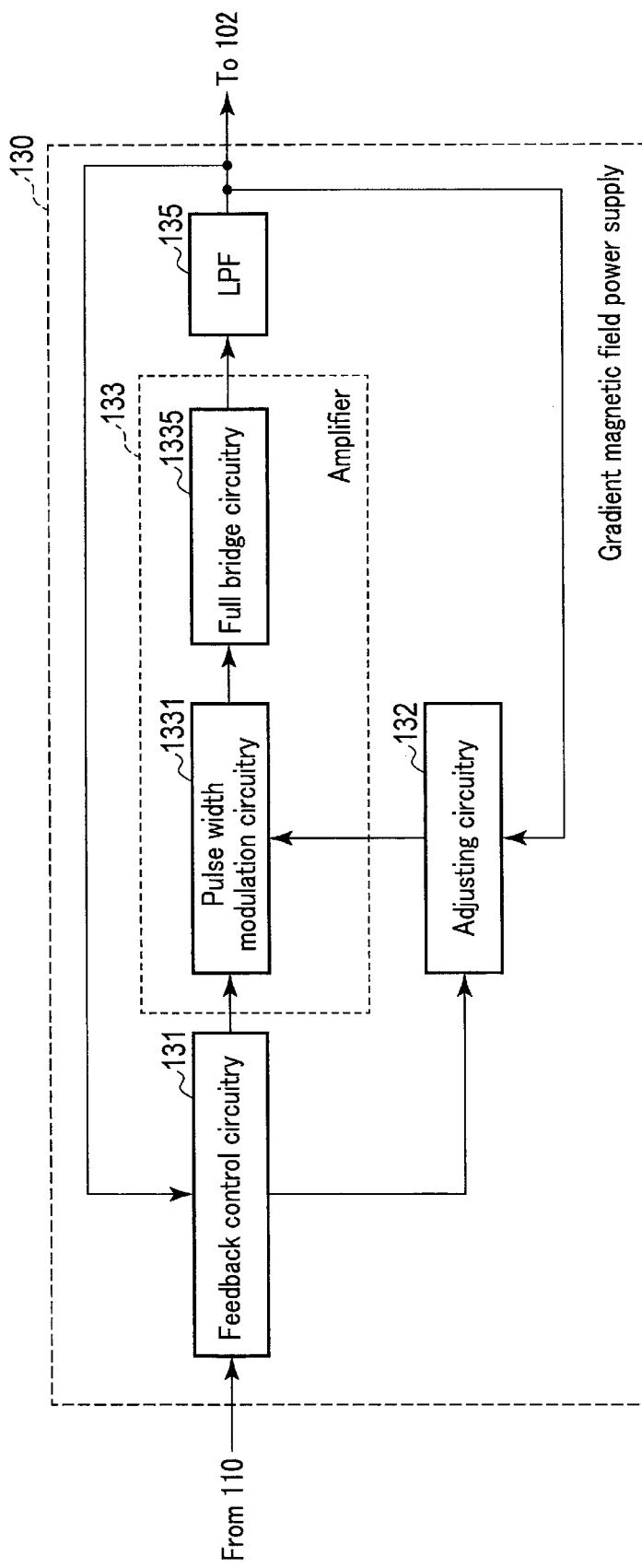
FIG. 20 is a block diagram illustrating the configuration of a gradient magnetic field power supply in a second modification of the embodiment.

FIG. 20 is a configuration diagram illustrating the configuration of a gradient magnetic field power supply 130 in the present modification. This gradient magnetic field power supply 130 differs from the gradient magnetic field power supply 130 of the present embodiment in that an output from the LPF 135 is input to the adjusting circuitry 132.

The adjusting circuitry 132 calculates a product ($I_{out} \times V_{out}$) of the current $I_{out}$ and output voltage $V_{out}$. In the period during which the input signal $I_{in}$ is being output to the feedback control circuitry 131, the adjusting circuitry 132 judges whether the time differential ($dI_{in}/dt$) of the input signal $I_{in}$ is non-zero or not. When the time differential ($dI_{in}/dt$) of the input signal $I_{in}$ is non-zero, the adjusting circuitry 132 judges whether the product ($I_{out} \times V_{out}$) is negative or not. In judging the falling period, the adjusting circuitry 132 judges a period, in which the product ($I_{out} \times V_{out}$) is negative, to be the falling period.

In the present modification, the adjusting circuitry 132 may judge the rising period, instead of judging the falling period as described above. In this case, the adjusting circuitry 132 judges a period, in which the product ($I_{out} \times V_{out}$) is positive, to be the rising period. At this time, the process in the adjusting function is the same as the process in the first modification.

(Adjusting Function)

Figure 21:
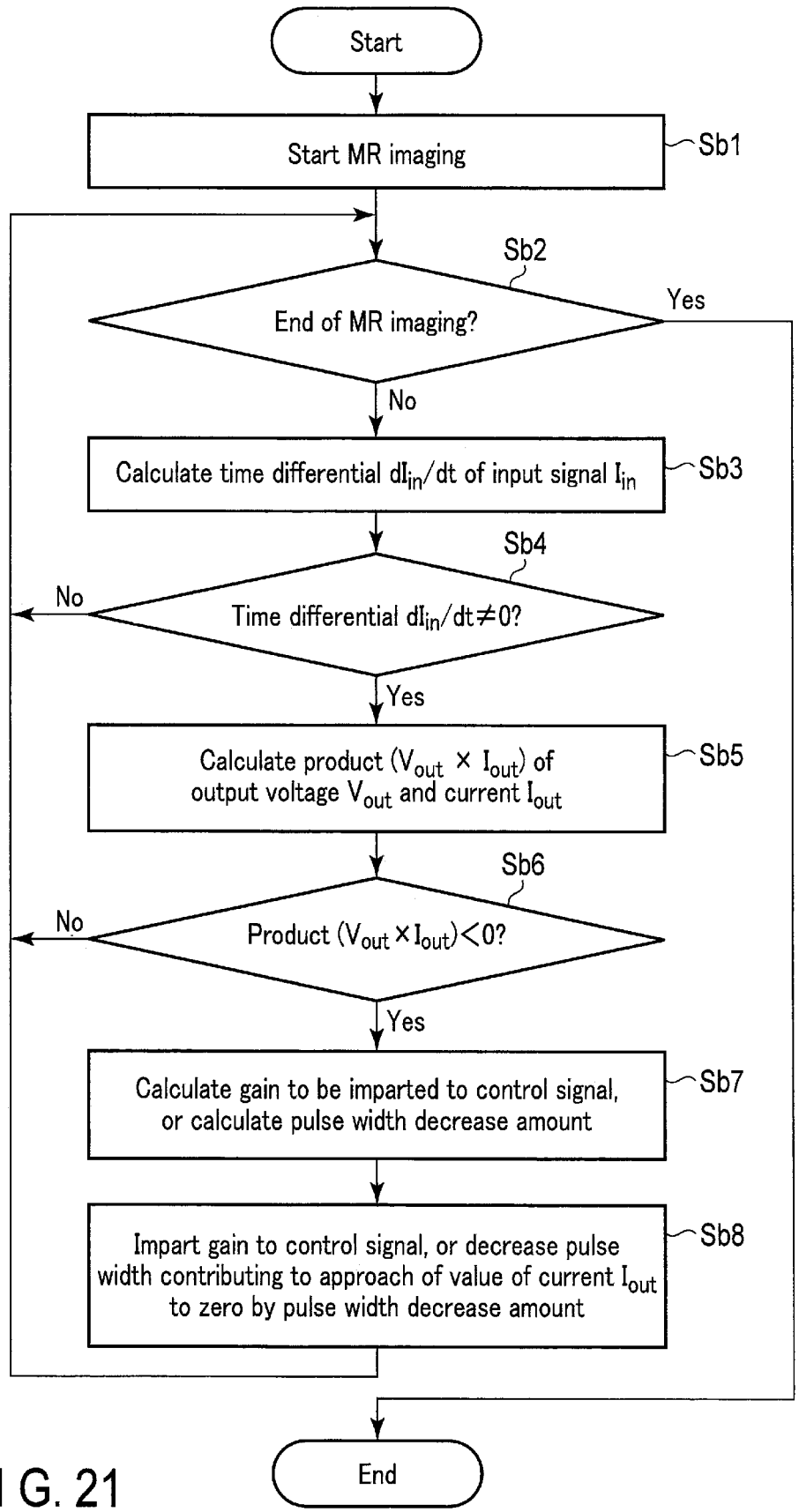
FIG. 21 is a flowchart illustrating an example of a process procedure in an adjusting function in the second modification of the embodiment.

FIG. 21 is a flowchart illustrating an example of the process procedure of the adjusting function in the present modification. The processes in steps Sb1 to Sb3, step Sb7 and step Sb8 are the same as the processes in steps Sa1 to Sa3, step Sa6 and step Sa1 in FIG. 19, so a description thereof is omitted here. The flowchart of FIG. 21 illustrates the adjusting function in the falling period. The adjusting function in the rising period will be described where necessary in connection with the related steps.

(Step Sb4)

The adjusting circuitry 132 judges whether the time differential ($dI_{in}/dt$) of the input signal $I_{in}$ is non-zero or not. If the time differential ($dI_{in}/dt$) of the input signal $I_{in}$ is zero (No in step Sb4), the process of step Sb2 and the process of step Sb3 are repeated. At this time, the output voltage $V_{out}$ by the PWM control on the control signal is applied to the gradient coil 102. If the time differential ($dI_{in}/dt$) of the input signal $I_{in}$ is non-zero (Yes in step Sb4), the process of step Sb5 is executed.

The process in this step is executed in order to prevent the process of step Sb7 and process of step Sb8 from being executed when the output voltage $V_{out}$ is non-zero and is constant. Thereby, the judgment of the period, in which the present adjusting function is executed, becomes more exact.

(Step Sb5)

The output voltage $V_{out}$ and current $I_{out}$ are output to the adjusting circuitry 132. The product ($I_{out} \times V_{out}$) of the current $I_{out}$ and output voltage $V_{out}$ is calculated by the adjusting circuitry 132.

(Step Sb6)

The adjusting circuitry 132 compares the product ($I_{out} \times V_{out}$) and zero, thereby judging the falling period or rising period. A period in which the product ($I_{out} \times V_{out}$) is negative is judged to be the falling period. At this time (Yes in step Sb6), the processes of step Sb7 and step Sb8 are executed. If the product ($I_{out} \times V_{out}$) is not negative (No in step Sb6), the processes of steps Sb2 to Sb5 are repeated. At this time, the output voltage $V_{out}$ by the PWM control on the control signal is applied to the gradient coil 102.

A period in which the product ($I_{out} \times V_{out}$) is positive may be judged to be the rising period. At this time, the processes of step Sa6 and step Sa7 in the first modification, which correspond to the processes of step Sb7 and step Sb8, are executed.

According to the above-described configuration, the following advantageous effects can be obtained in addition to the advantageous effects of the present embodiment.

According to the magnetic resonance imaging apparatus 100 in the present modification, in the period during which the input signal $I_{in}$ is being output to the feedback control circuitry 131, a period, in which the time differential ($dI_{in}/dt$) of the input signal $I_{in}$ is non-zero and the product ($I_{out} \times V_{out}$) of the output voltage $V_{out}$ and current $I_{out}$ is negative, is judged to be the falling period in which the value of the current $I_{out}$ approaches zero in the waveform of the current $I_{out}$, and during the falling period, the adjustment of the gain for the control signal can be executed or the adjustment of the pulse width of the driving signal, which contributes to the attenuation of the current $I_{out}$, can be executed. Besides, according to the magnetic resonance imaging apparatus 100 in the present modification, in the period during which the input signal $I_{in}$ is being output to the feedback control circuitry 131, a period, in which the time differential ($dI_{in}/dt$) of the input signal $I_{in}$ is non-zero and the product ($I_{out} \times V_{out}$) of the output voltage $V_{out}$ and current $I_{out}$ is positive, is judged to be the rising period in which the value of the current $I_{out}$ varies away from zero in the waveform of the current $I_{out}$, and during the rising period, the adjustment of the gain for the control signal can be executed or the adjustment of the pulse width of the driving signal, which contributes to the amplification of the current $I_{out}$, can be executed.

From the above, according to the present modification, when the time differential ($dI_{in}/dt$) of the input signal $I_{in}$ is zero, i.e. when the output voltage $V_{out}$ is non-zero and is constant, the process of step Sb7 and process of step Sb8 are not executed. Therefore, the judgment of the period, in which the present adjusting function is executed, becomes more exact, and the robustness of the present adjusting function is improved. Thereby, according to this modification, the symmetry of the current waveform (trapezoidal wave) can be enhanced, and the quality of the image that is generated by the image generation function 152 can be enhanced.

(Third Modification)

The present modification differs from the embodiment in that the adjustment of the gain or the adjustment of the pulse width is executed over the falling period in response to a falling trigger signal which is indicative of the falling period. In the meantime, in this modification, the adjustment of the gain or the adjustment of the pulse width may be executed over the rising period in response to a rising trigger signal which is indicative of the rising period. Besides, in this modification, the adjustment of the gain or the adjustment of the pulse width may be executed over the rising period and falling period in response to the falling trigger signal and rising trigger signal, respectively.

Figure 22:
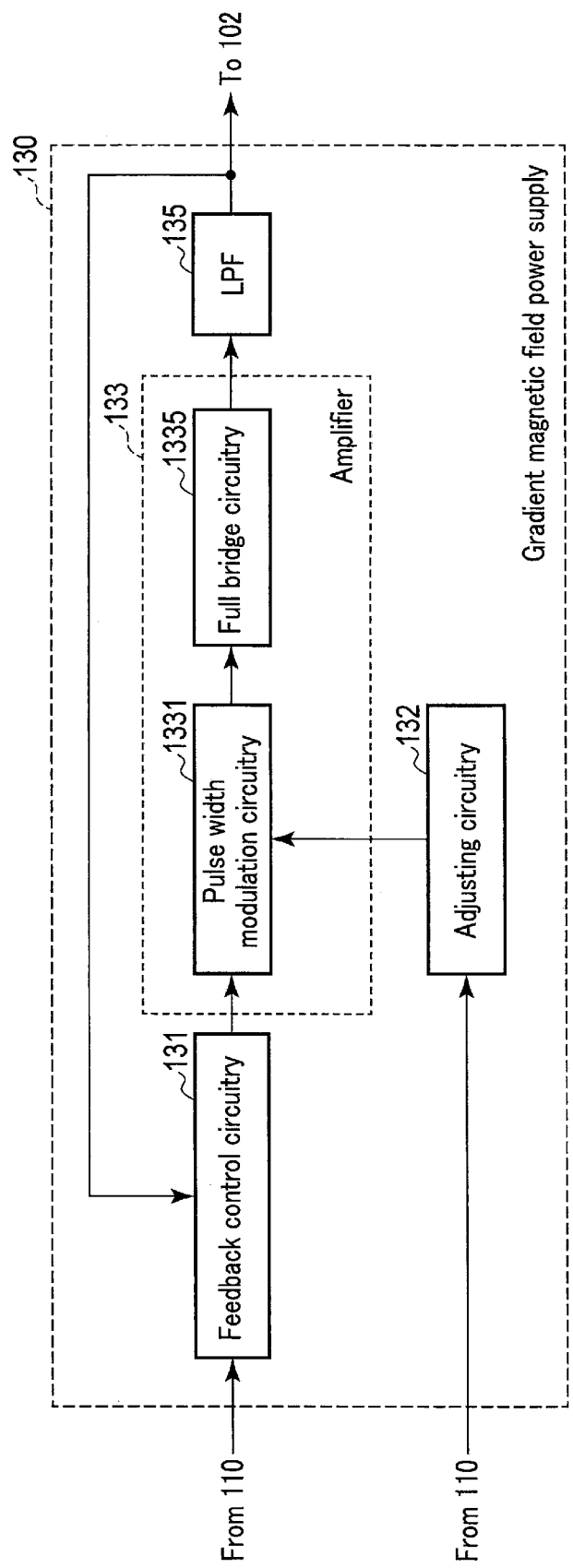
FIG. 22 is a block diagram illustrating the configuration of a gradient magnetic field power supply in a third modification of the embodiment.

FIG. 22 is a configuration diagram illustrating the configuration of a gradient magnetic field power supply 130 in the present modification. This gradient magnetic field power supply 130 differs from the gradient magnetic field power supply 130 of the present embodiment in that at least one of a rising trigger signal and a falling trigger signal, which are output from the sequence control circuitry 110, is input to the adjusting circuitry 132. In this case, a signal line for outputting the input signal $I_{in}$ to the feedback control circuitry 131, and a signal line for outputting at least one of the rising trigger signal and falling trigger signal to the adjusting circuitry 132, are provided between the sequence control circuitry 110 and gradient magnetic field power supply 130.

The storage circuitry 123 stores, in accordance with each of imaging sequences, the falling trigger signal indicative of the falling period in association with the input signal $I_{in}$. Since the input signal $I_{in}$ corresponds to the waveform of the gradient magnetic field, the falling trigger signal is a signal indicative of the falling period in the current $I_{out}$ relating to the generation of the waveform of the gradient magnetic field, and the falling trigger signal is a signal synchronized with the input signal $I_{in}$ with the processing time of the feedback control being taken into account. The falling trigger signal is, for example, a binary signal which is in an ON state in the falling period and in an OFF state in the non-falling period. Incidentally, the storage circuitry 123 may store the rising trigger signal indicative of the rising period in association with the input signal $I_{in}$. The rising trigger signal is, for example, a binary signal which is in an ON state in the rising period and in an OFF state in the non-rising period.

Responding to the start of MR imaging, the sequence control circuitry 110 outputs the falling trigger signal to the gradient magnetic field power supply 130 in synchronism with the input signal $I_{in}$. Specifically, the sequence control circuitry 110 outputs the input signal $I_{in}$ to the feedback control circuitry 131, and outputs the falling trigger signal to the adjusting circuitry 132. Incidentally, responding to the start of MR imaging, the sequence control circuitry 110 may output the rising trigger signal to the gradient magnetic field power supply 130 in synchronism with the input signal $I_{in}$.

Responding to the falling trigger signal, the adjusting circuitry 132 executes, over the falling period, the adjustment of the gain of the control signal or the adjustment of the pulse width of the driving signal contributing to the attenuation of the current $I_{out}$. Specifically, the adjusting circuitry 132 executes the adjustment of the gain or the adjustment of the pulse width over the period in which the falling trigger signal is in the ON state. Incidentally, responding to the rising trigger signal, the adjusting circuitry 132 may execute the adjustment of the gain or the adjustment of the pulse width over the period (rising period) in which the rising trigger signal is in the ON state.

(Adjusting Function)

Figure 23:
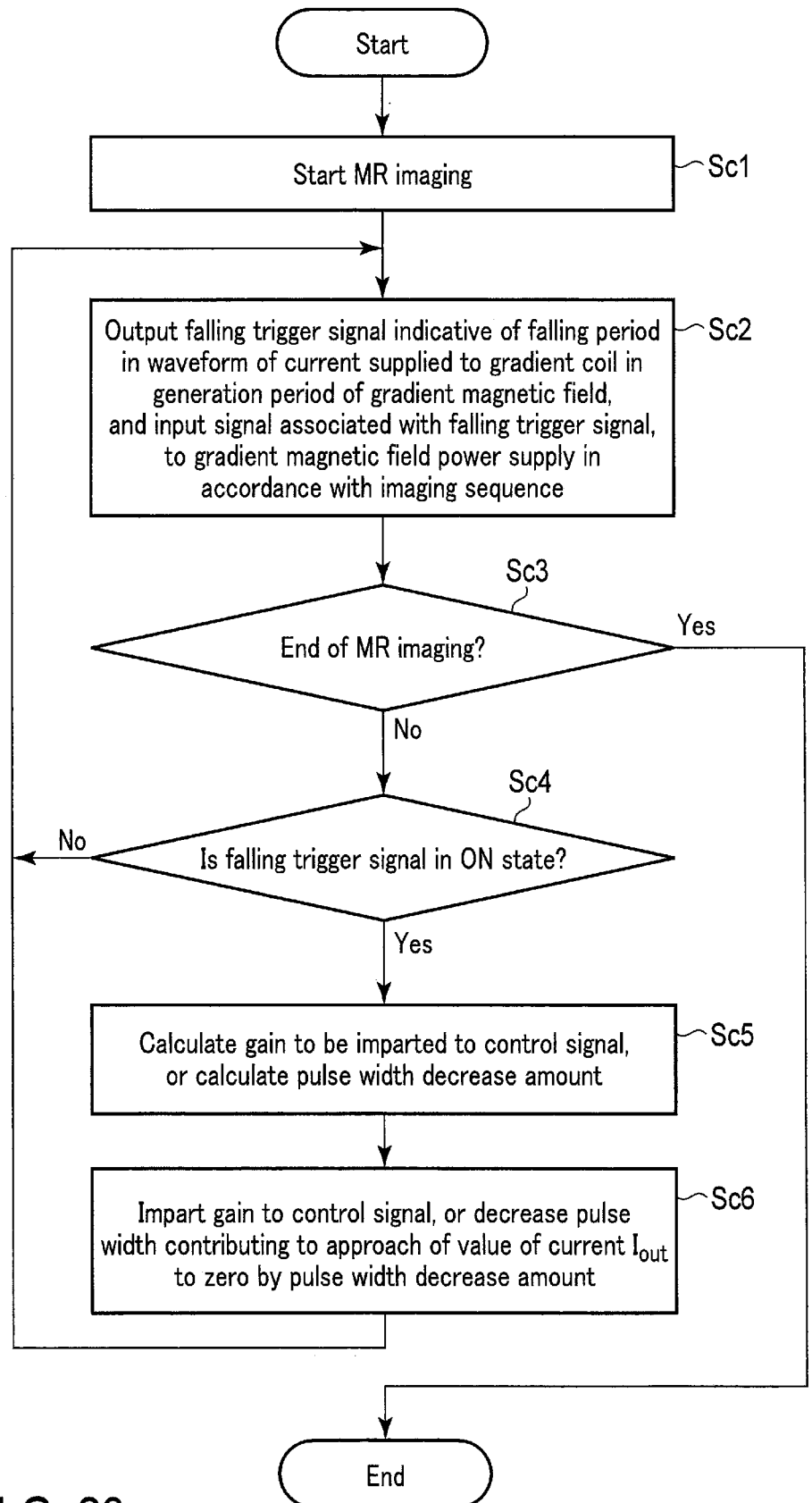
FIG. 23 is a flowchart illustrating an example of a process procedure in an adjusting function in the third modification of the embodiment.

FIG. 23 is a flowchart illustrating an example of the process procedure of the adjusting function in the present modification. The processes in step Sc1, step Sc3, step Sc5 and step Sc6 are the same as the processes in step Sa1, step Sa2, step Sa6 and step Sa7 in FIG. 19, so a description thereof is omitted here. The flowchart of FIG. 23 illustrates the adjusting function in the falling period. The adjusting function in the rising period will be described where necessary in connection with the related steps.

(Step Sc2)

Responding to the start of MR imaging, the input signal $I_{in}$ included in the information of the imaging sequence corresponding to the started MR imaging and the falling trigger signal corresponding to this input signal $I_{in}$ are read out by the sequence control circuitry 110 from the storage circuitry 123 in accordance with the imaging sequence. The read-out input signal $I_{in}$ and falling trigger signal are synchronously output to the gradient magnetic field power supply 130.

In the meantime, when the adjusting function is executed in the rising period, the input signal $I_{in}$ and the rising trigger signal corresponding to this input signal $I_{in}$ are read out by the sequence control circuitry 110 from the storage circuitry 123. The read-out input signal $I_{in}$ and rising trigger signal are synchronously output to the gradient magnetic field power supply 130.

(Step Sc4)

The adjusting circuitry 132 judges whether the falling trigger signal is in the ON state or not. If the falling trigger signal is in the ON state (Yes in step Sc4), the processes of step Sc5 and step Sc6 are executed. Specifically, the processes of step Sc5 and step Sc6 are executed over the falling period in response to the ON state of the falling trigger signal. If the falling trigger signal is not in the ON state (No in step Sc4), the output voltage $V_{out}$ by the PWM control on the control signal is applied to the gradient coil 102.

The adjusting circuitry 132 may judge whether the rising trigger signal is in the ON state or not. If the rising trigger signal is in the ON state, the processes of step Sa6 and step Sa7 in the first modification, which correspond to the processes of step Sc5 and step Sc6, are executed. Specifically, these processes are executed over the rising period in response to the ON state of the rising trigger signal.

According to the above-described configuration, the following advantageous effects can be obtained in addition to the advantageous effects of the present embodiment.

According to the magnetic resonance imaging apparatus 100 in the present modification, the falling trigger signal indicative of the falling period, in which the value of the current $I_{out}$ approaches zero in the waveform of the current $I_{out}$ in the generation period of the gradient magnetic field, is stored in association with the input signal $I_{in}$. Responding to the ON state of the falling trigger signal, the adjustment of the gain of the control signal or the adjustment of the pulse width of the driving signal contributing to the attenuation of the current $I_{out}$ can be executed over the falling period. In addition, according to the magnetic resonance imaging apparatus 100, the rising trigger signal indicative of the rising period, in which the value of the current $I_{out}$ varies away from zero in the waveform of the current $I_{out}$ in the generation period of the gradient magnetic field, is stored in association with the input signal $I_{in}$. Responding to the rising trigger signal, the adjustment of the gain of the control signal, or the adjustment of the pulse width of the driving signal contributing to the amplification of the current $I_{out}$, can be executed over the rising period.

From the above, according to the present modification, the adjustment of the gain of the control signal or the adjustment of the pulse width of the driving signal can be executed without judging the rising period and the falling period. Thereby, the symmetry of the current waveform (trapezoidal wave) can be improved more easily, and the quality of the image that is generated by the image generation function 152 can be enhanced more easily.

According to the magnetic resonance imaging apparatuses 100 of the above-described embodiment and at least one of the above-described modifications, in the waveform of the current $I_{out}$ in the load part LP relating to the generation of the gradient magnetic field, the symmetry between the waveform in the rising period and the waveform in the falling period can be secured, and the quality of the image that is generated by the magnetic resonance imaging apparatus 100 can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
an amplifier including pulse width modulation circuitry configured to modulate a pulse width of a driving signal, which is input to a plurality of switching elements, in accordance with an input of a control signal corresponding to a waveform of a gradient magnetic field;

a gradient coil configured to generate the gradient magnetic field by an electric current supplied in accordance with an output voltage which is output from the amplifier; and circuitry configured to execute adjustment of a gain of the amplifier, which is included in the control signal, or adjustment of the pulse width of the driving signal, in accordance with a dead time included in a switching cycle of the switching elements, so as to form a symmetric relationship between a waveform of the gradient magnetic field in a rising period during which a value of a current in the gradient coil varies away from zero and a waveform of the gradient magnetic field in a falling period during which a value of a current in the gradient coil approaches zero, the symmetric relationship being realized by setting an angle in which a current waveform is inclined in the rising period same as an angle in which the current waveform is inclined in the falling period.

2. The magnetic resonance imaging apparatus of claim 1, wherein the adjusting circuitry is configured to adjust a gain of the control signal in accordance with a ratio of the dead time to the switching cycle.

3. The magnetic resonance imaging apparatus of claim 1, wherein the adjusting circuitry is configured to adjust a decrease amount of the pulse width in accordance with a length of the dead time.

4. The magnetic resonance imaging apparatus of claim 1, further comprising:

full bridge circuitry including the switching elements and configured to apply the output voltage to the gradient coil in accordance with the pulse width modulated according to the adjusted control signal, or in accordance with the adjusted pulse width; and feedback control circuitry configured to execute feedback control on an input signal corresponding to the waveform of the gradient magnetic field by using a value of the current, and configured to output the control signal to the pulse width modulation circuitry.

5. The magnetic resonance imaging apparatus of claim 4, wherein the adjusting circuitry is configured:

to judge, in a period during which the input signal is being output to the feedback control circuitry, a period, in which a product of a time differential of the input signal and the input signal is negative, to be the falling period; and to execute, over the falling period, the adjustment of the gain or the adjustment of the pulse width.

6. The magnetic resonance imaging apparatus of claim 5, wherein the adjusting circuitry is configured:

to impart, as the adjustment of the gain in the falling period, a differential value to the control signal as the gain, the differential value being obtained by subtracting from 1 an integrated value between double a total number of the dead times in the switching cycle and a ratio of the dead time to the switching cycle; and to decrease, as the adjustment of the pulse width in the falling period, the pulse width contributing to attenuation of the current by double the integrated value of the dead time in the switching cycle.

7. The magnetic resonance imaging apparatus of claim 4, wherein the adjusting circuitry is configured:

to judge, in a period during which the input signal is being output to the feedback control circuitry, a period, in which a time differential of the input signal is non-zero and a product of the output voltage and the current is negative, to be the falling period; and to execute, over the falling period, the adjustment of the gain or the adjustment of the pulse width.

8. The magnetic resonance imaging apparatus of claim 4, further comprising storage circuitry configured to store, in association with the input signal, a falling trigger signal indicative of the falling period, wherein the adjusting circuitry is configured to execute, responding to an ON state of the falling trigger signal, the adjustment of the gain or the adjustment of the pulse width over the falling period.

9. The magnetic resonance imaging apparatus of claim 4, wherein the adjusting circuitry is configured:

to judge, in a period during which the input signal is being output to the feedback control circuitry, a period, in which a product of a time differential of the input signal and the input signal is positive, to be the rising period; and to execute, over the rising period, the adjustment of the gain or the adjustment of the pulse width.

10. The magnetic resonance imaging apparatus of claim 9, wherein the adjusting circuitry is configured:

to impart, as the adjustment of the gain in the rising period, an integrated value to the control signal as the gain, the integrated value being obtained by an integration between double a total number of the dead times in the switching cycle and a ratio of the dead time to the switching cycle; and to increase, as the adjustment of the pulse width in the rising period, the pulse width contributing to amplification of the current by double the integrated value of the dead time in the switching cycle.

11. The magnetic resonance imaging apparatus of claim 4, wherein the adjusting circuitry is configured:

to judge, in a period during which the input signal is being output to the feedback control circuitry, a period, in which a time differential of the input signal is non-zero and a product of the output voltage and the current is positive, to be the rising period; and to execute, over the rising period, the adjustment of the gain or the adjustment of the pulse width.

12. The magnetic resonance imaging apparatus of claim 4, further comprising storage circuitry configured to store, in association with the input signal, a rising trigger signal indicative of the rising period, wherein the adjusting circuitry is configured to execute, responding to an ON state of the rising trigger signal, the adjustment of the gain or the adjustment of the pulse width over the rising period.

* * * * *